United States Patent
Beck et al.

(10) Patent No.: US 12,500,324 B2
(45) Date of Patent: Dec. 16, 2025

(54) MULTIPOLE MULTIBAND ISOLATOR DEVICES

(71) Applicant: International Business Machines Corporation, Armonk, NY (US)

(72) Inventors: Matthew Beck, Danbury, CT (US); Michael Karunendra Selvanayagam, Ossining, NY (US); Corrado P Mancini, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 212 days.

(21) Appl. No.: 18/344,977

(22) Filed: Jun. 30, 2023

(65) Prior Publication Data

US 2025/0007141 A1    Jan. 2, 2025

(51) Int. Cl.
| | |
|---|---|
| *H01P 1/397* | (2006.01) |
| *H01P 1/36* | (2006.01) |
| *H03H 11/04* | (2006.01) |
| *H10N 60/12* | (2023.01) |

(52) U.S. Cl.
CPC .............. *H01P 1/36* (2013.01); *H01P 1/397* (2013.01); *H03H 11/04* (2013.01); *H10N 60/12* (2023.02)

(58) Field of Classification Search
CPC ...... H01P 1/32; H01P 1/36; H01P 1/38; H01P 1/397; H03H 11/0405; H03H 11/04; G06N 10/00; G06N 10/20; H10N 60/12; H10N 60/10; H10N 60/805
See application file for complete search history.

(56) References Cited

U.S. PATENT DOCUMENTS

| | | |
|---|---|---|
| 9,509,274 B2 | 11/2016 | Naaman et al. |
| 10,050,630 B2 | 8/2018 | Reagor et al. |
| 11,105,866 B2 | 8/2021 | Swenson et al. |
| 11,177,912 B2 | 11/2021 | Elsherbini et al. |
| 2016/0308502 A1 | 10/2016 | Abdo et al. |
| 2017/0093381 A1 | 3/2017 | Abdo |
| 2021/0066570 A1 | 3/2021 | Luethi et al. |
| 2022/0115577 A1 | 4/2022 | Beck et al. |
| 2022/0263468 A1 | 8/2022 | Yamamoto et al. |
| 2023/0052753 A1 | 2/2023 | Govenius et al. |
| 2023/0119964 A1 | 4/2023 | Beck et al. |
| 2023/0208419 A1 | 6/2023 | Mancini et al. |

(Continued)

FOREIGN PATENT DOCUMENTS

WO    2025/003124 A1    1/2025

OTHER PUBLICATIONS

F. Lecocq et al., "Nonreciprocal Microwave Signal Processing with a Field-Programmable Josephson Amplifier," arXiv:1612.01438v1, Dec. 5, 2016, 17 pages.

(Continued)

*Primary Examiner* — Stephen E. Jones
(74) *Attorney, Agent, or Firm* — Erik Johnson; Ryan, Mason & Lewis, LLP

(57) ABSTRACT

A device comprises filter circuitry and non-linear mixing devices. The filter circuitry comprises a first port, a second port, a first bandpass filter, and a second bandpass filter. The non-linear mixing devices are responsive to control signals to couple poles of the first bandpass filter to respective poles of the second bandpass filter to cause non-reciprocal transmission of signals from the first port to the second port.

25 Claims, 11 Drawing Sheets

(56) References Cited

U.S. PATENT DOCUMENTS

2024/0372241 A1* 11/2024 Khaira ................... H01P 1/397
2025/0255196 A1   8/2025 Beck et al.

OTHER PUBLICATIONS

M. A. Beck, et al., "Wideband Josephson Parametric Isolator," arXiv:2212.08563v1, Dec. 16, 2022, 10 pages.
O. Naaman et al., "Synthesis of Parametrically-Coupled Networks," arXiv:2109.11628v4, Apr. 27, 2022, 37 pages.
D. Simpson et al., "Non-Reciprocal Balanced Bandpass Filters With Quasi-Elliptic Response," IEEE Transactions on Circuits and Systems II, vol. 69, No. 12, Aug. 29, 2022, 5 pages.
O. Naaman et al., "Synthesis of Parametrically-Coupled Networks," https://doi.org/10.1103/PRXQuantum.3.020201, Feb. 15, 2022, 37 pages.
PCT/EP2024/067790, International Search Report and Written Opinion, Oct. 30, 2024, 15 pages.

\* cited by examiner

MULTIPOLE MULTIBAND ISOLATOR DEVICES

BACKGROUND

This disclosure relates generally to quantum computing and, in particular, microwave isolator devices and isolation techniques for use with, e.g., superconducting quantum computing systems. A superconducting quantum computing system is implemented using circuit quantum electrodynamics (QED) devices, which utilize the quantum dynamics of electromagnetic fields in superconducting circuits that include superconducting quantum bits, to generate and process quantum information. In general, superconducting quantum bits (qubits) are electronic circuits which are implemented using components such as superconducting tunnel junctions (e.g., Josephson junctions), inductors, and/or capacitors, etc., and which behave as quantum mechanical anharmonic (non-linear) oscillators with quantized states, when cooled to cryogenic temperatures.

The cryogenic hardware that is utilized to construct a quantum computer with superconducting qubits requires a variety of microwave components including microwave couplers, filter, amplifiers, circulators, and isolators. Traditionally, these components are implemented via discrete components that are implemented in qubit control and readout signal paths. As the number of qubits that are implemented in a quantum processor increases to hundreds or thousands or more, the integration of these peripheral components in a manner that reduces overall footprint, thermal load, and added noise in the overall system, is a key challenge to scaling. Ferrite-based microwave isolators are one of the physically largest devices that continue to remain as discrete components. They are generally employed in a qubit readout chain to protect qubits and resonators from broadband noise and unwanted signals emanating from downstream components such as amplifiers. As a consequence of their bulky construction, the need to place a large number of such ferrite-based microwave isolators at the mixing chamber of a dilution refrigerator to support increasing qubit counts poses a limitation to system scaling and integration.

SUMMARY

Exemplary embodiments of the disclosure include techniques for implementing isolation circuits that provide non-reciprocal transmission of signals in signal paths of a quantum computing system. For example, an exemplary embodiment includes a device which comprises filter circuitry and non-linear mixing devices. The filter circuitry comprises a first port, a second port, a first bandpass filter, and a second bandpass filter. The non-linear mixing devices are responsive to control signals to couple poles of the first bandpass filter to respective poles of the second bandpass filter to cause non-reciprocal transmission of signals from the first port to the second port.

Advantageously, the device can be utilized in place of discrete ferrite-based isolator devices to enable non-reciprocal transmission of signals in the signal paths, e.g., qubit control and readout chains of a quantum computing system, and thereby reduce the cost and footprint for implementing isolation in such control and readout chains. The device provides a non-magnetic solution to isolation and can be disposed in relatively close proximity to a quantum processor and/or integrated therewith on an integrated circuit chip, while having a much smaller footprint as compared to discrete ferrite-based isolation devices, and while providing isolation and electrical characteristics that are similar to ferrite-based isolation devices.

In another exemplary embodiment, a system comprises a quantum processor comprising quantum bits, and a readout signal path configured to transmit signals that are readout from one or more of the quantum bits of the quantum processor. The readout signal path comprises an isolator circuit. The isolator circuit comprises a first port, a second port, a first bandpass filter, and a second bandpass filter, and non-linear mixing devices. The non-linear mixing devices are responsive to control signals to couple poles of the first bandpass filter to respective poles of the second bandpass filter to cause non-reciprocal transmission of signals through the isolator circuit from the first port to the second port.

In another exemplary embodiment, as may be combined with the preceding paragraphs, the first bandpass filter comprises a first passband with a first center frequency and the second bandpass filter comprises a second passband with a second center frequency. The first passband and the second passband are non-overlapping passbands. The control signals applied to the non-linear mixing devices comprise radio frequency signals having a frequency which is a function of a difference between the first center frequency and the second center frequency.

Advantageously, the isolator circuit with a multi-bandpass filter architecture allows the bandpass filters to be designed with disparate, non-overlapping passbands, wherein the control signal can have a frequency that is outside the first and second passbands of the first and second multipole bandpass filters. In addition, the relationship between the control signal frequency and the first and center frequencies of the respective first and second passbands provides flexibility in the design of the isolator circuit. For example, given a desired center frequency of the first bandpass filter and a desired control signal frequency, the second bandpass filter can be designed to have the requisite center frequency based on the desired control signal frequency and center frequency of the first bandpass filter.

Another exemplary embodiment includes a device which comprises an isolator circuit. The isolator circuit comprises a first port and a second port, a first multipole immittance inverting bandpass filter, a second multipole immittance inverting bandpass filter, non-linear mixing devices, and a transmission line commonly coupled to each of the non-linear mixing devices. The non-linear mixing devices couple poles of the first multipole immittance inverting bandpass filter to respective poles of the second multipole immittance inverting bandpass filter. The transmission line is configured to apply a control signal to each of the non-linear mixing devices at a given frequency with different phase shifts, to cause non-reciprocal transmission of signals from the first port to the second port of the isolator circuit.

Advantageously, the transmission line can be designed to have an electrical/physical length (based on a frequency of the control signal) which imparts a desired phase shift (phase difference) of the control signal that is applied to the non-linear mixing devices at different points along the transmission line. This configuration allows the use of one common control signal line to extend through, e.g., a cryostat to the isolation circuit and feed a single control signal (e.g., radio frequency signal on the order of one or more GHz) to drive all non-linear mixing devices coupled to different points along the transmission line. With a control signal frequency on the order of GHz, the electrical length of the transmission line is small enough to be fabricated "on chip" with the isolation circuit to reduce control signal I/O overhead to the isolator circuit, and other similar isolator circuits in signals paths of a given quantum processing system.

Another exemplary embodiment includes a system which comprises a quantum processor comprising quantum bits, and a readout signal path configured to transmit signals that are readout from one or more of the quantum bits of the quantum processor. The readout signal path comprises an isolator circuit. The isolator circuit comprises a first port and a second port, a first multipole immittance inverting bandpass filter, a second multipole immittance inverting bandpass filter, non-linear mixing devices, and a transmission line commonly coupled to each of the non-linear mixing devices. The non-linear mixing devices couple poles of the first multipole immittance inverting bandpass filter to respective poles of the second multipole immittance inverting bandpass filter. The transmission line is configured to apply a control signal to each of the non-linear mixing devices at a given frequency with different phase shifts, to cause non-reciprocal transmission of signals from the first port to the second port of the isolator circuit.

Another embodiment includes a method which comprises applying control signals to non-linear mixing devices, configured to couple poles of a first bandpass filter to respective poles of a second bandpass filter, to cause non-reciprocal transmission of signals from a first port of the first bandpass filter to a second port of the first bandpass filter.

In another exemplary embodiment, as may be combined with the preceding paragraphs, the non-linear mixing devices comprise direct current superconducting quantum interference devices.

In another exemplary embodiment, as may be combined with the preceding paragraphs, the non-linear mixing devices comprise Josephson parametric converter devices, wherein each Josephson parametric converter device comprises a Josephson ring modulator which is configured to couple respective poles of the first bandpass filter and the second bandpass filter.

Other embodiments will be described in the following detailed description of exemplary embodiments, which is to be read in conjunction with the accompanying figures.

BRIEF DESCRIPTION OF THE DRAWINGS

FIG. 5 schematically illustrates a Josephson multipole multiband isolator circuit, according to another exemplary embodiment of the disclosure.

DETAILED DESCRIPTION

Figure 1:
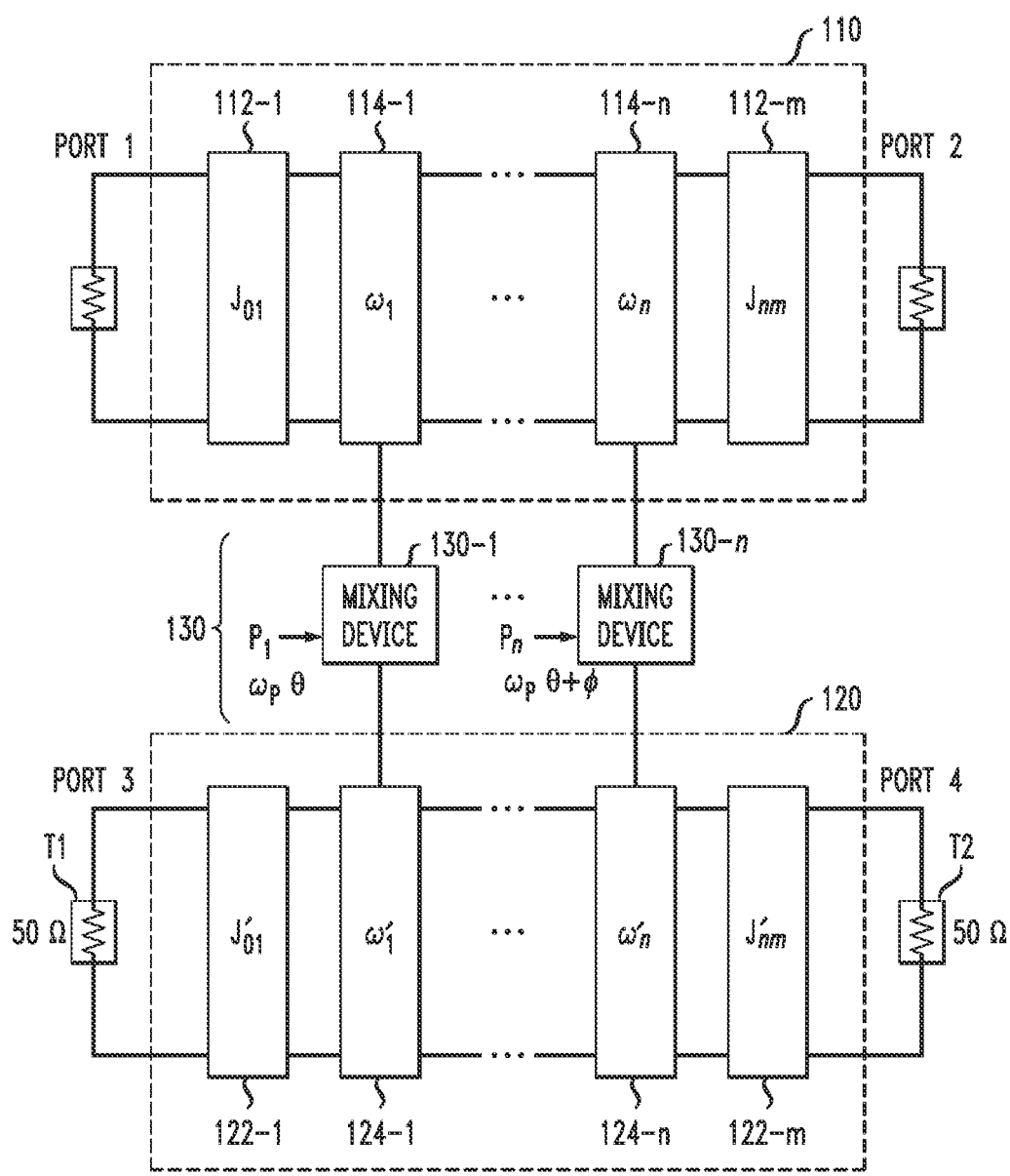
FIG. 1 is a high-level schematic illustration of a Josephson multipole multiband isolator circuit, according to an exemplary embodiment of the disclosure.

Exemplary embodiments of the disclosure will now be described in further detail with regard to isolator circuitry for use with quantum computing systems. In particular, exemplary embodiments of the disclosure include Josephson multipole multiband isolator circuits that can be utilized to provide isolation between cryogenic components in a dilution refrigeration system. For example, the exemplary Josephson multipole multiband isolator circuits as discussed herein can be implemented to provide isolation in readout signal chains between a quantum processor and readout circuitry when reading the quantum states of superconducting qubits of the quantum processor.

It is to be understood that the various features shown in the accompanying drawings are schematic illustrations that are not drawn to scale. Moreover, the same or similar reference numbers are used throughout the drawings to denote the same or similar features, elements, or structures, and thus, a detailed explanation of the same or similar features, elements, or structures will not be repeated for each of the drawings. Further, the term "exemplary" as used herein means "serving as an example, instance, or illustration." Any embodiment or design described herein as "exemplary" is not to be construed as preferred or advantageous over other embodiments or designs.

Further, it is to be understood that the phrase "configured to" as used in conjunction with a circuit, structure, element, component, or the like, performing one or more functions or otherwise providing some functionality, is intended to encompass embodiments wherein the circuit, structure, element, component, or the like, is implemented in hardware, software, and/or combinations thereof, and in implementations that comprise hardware, wherein the hardware may comprise quantum circuit elements (e.g., quantum processors, quantum bits, Josephson junction devices, Josephson parametric converters (JPCs), quantum-limited amplifiers (QLAs), qubit coupler circuitry, Josephson multipole multiband isolator circuits, etc.), discrete circuit elements (e.g., transistors, inverters, etc.), programmable elements (e.g., application specific integrated circuit (ASIC) chips, field-programmable gate array (FPGA) chips, etc.), processing devices (e.g., central processing units (CPUs), graphics processing units (GPUs), etc.), one or more integrated circuits, and/or combinations thereof. Thus, by way of example only, when a circuit, structure, element, component, etc., is defined to be configured to provide a specific functionality, it is intended to cover, but not be limited to, embodiments where the circuit, structure, element, component, etc., is comprised of elements, processing devices, and/or integrated circuits that enable it to perform the specific functionality when in an operational state (e.g., connected or otherwise deployed in a system, powered on, receiving an input, and/or producing an output), as well as cover embodiments when the circuit, structure, element, component, etc., is in a non-operational state (e.g., not connected nor otherwise deployed in a system, not powered on, not receiving an input, and/or not producing an output) or in a partial operational state.

FIG. 1 is a high-level schematic illustration of a Josephson multipole multiband isolator circuit, according to an exemplary embodiment of the disclosure. In particular, FIG. 1 schematically illustrates a Josephson multipole multiband isolator circuit 100 which comprises a first multipole bandpass filter 110, a second multipole bandpass filter 120, and a plurality (n) of non-linear mixing devices 130-1, . . . , 130-n (generally, mixing devices 130). The first multipole bandpass filter 110 comprises an admittance inverting multipole bandpass filter network comprising a first port (Port 1), a second port (Port 2), a plurality (m) of admittance inverters 112-1, . . . , 112-m (generally, admittance inverters 112), and a plurality (n) of shunt resonators 114-1, . . . 114-n (generally, shunt resonators 114). The shunt resonators 114-1, . . . , 114-n (e.g., LC resonators) are comprised of respective resonant (angular) frequencies $\omega_1, \ldots, \omega_n$, wherein n denotes number of "poles" of the first multipole bandpass filter 110. Each shunt resonator 114-1, . . . , 114-n is disposed between two admittance inverters 112, such that the number m of admittance inverters 112 is m=n+1. The admittance inverters 112 essentially function as impedance matching circuits (e.g., to match impedance between adjacent shunt resonators 114 and match impedance between Port 1 and Port 2 and shunt resonators 114 adjacent to the ports). The admittance inverters 112 may be implemented using capacitive π-networks, inductive π-networks, and/or quarter-wavelength transmission lines.

Similarly, the second multipole bandpass filter 120 comprises an admittance inverting multipole bandpass filter network comprising a first termination T1 and a second termination T2 (e.g., 50 Ohm terminations), a plurality (m) of admittance inverters 122-1, . . . , 122-m (generally, admittance inverters 122), and a plurality (n) of shunt resonators 124-1, . . . 124-n (generally, shunt resonators 124). In the exemplary embodiment, the second multipole bandpass filter 120 comprises ports, Port 3 and Port 4, which are terminated. The shunt resonators 124-1, . . . , 124-n (e.g., LC resonators) comprise respective resonant (angular) frequencies $w'_1, \ldots w'_n$, wherein n denotes number of "poles" of the second multipole bandpass filter 120. Each shunt resonator 124-1, . . . , 124-n is disposed between two admittance inverters 122, such that the number m of admittance inverters 122 is m=n+1. The admittance inverters 122 may be implemented using capacitive π-networks, inductive π-networks, and/or quarter-wavelength transmission lines.

As schematically illustrated in FIG. 1, the shunt resonators 114-1, . . . , 114-n of the first multipole bandpass filter 110 are coupled to the shunt resonators 124-1, . . . , 124-n, respectively, of the second multipole bandpass filter 120. In particular, the shunt resonators 114-1 and 124-1 are coupled through the mixing device 130-1, and the shunt resonators 114-n and 124-n are coupled through the mixing device 130-n. In general, the non-linear mixing devices 130 comprise superconducting non-linear elements (e.g., Josephson junctions) to enable, e.g., three-wave mixing functions (parametric signal mixing). As explained in further detail below, the non-linear mixing devices 130 can be implemented using devices with superconducting non-linear inductances, such as direct current superconducting quantum interference devices (DC-SQUIDs), Josephson parametric converters (JPCs) having Josephson ring modulators, etc.

The Josephson multipole multiband isolator circuit 100 is configured to provide isolation (e.g., broadband non-reciprocal transmission) by designing the first and second multipole bandpass filters 110 and 120 to have disparate, non-overlapping passbands. For example, the first multipole bandpass filter 110 has a first passband (e.g., signal passband, denoted $B_{Signal}$) with a center (angular) frequency of $\omega_C$, and the second multipole bandpass filter 120 has a second passband (e.g., idler passband, denoted $B_{Idler}$) with a center (angular) frequency of co. In some embodiments, the mixing devices 130-1, . . . , 130-n are driven by respective radio frequency (RF) pump signals, $P_1, \ldots, P_n$ which have the same frequency $\omega_P$, but with different phases and/or amplitudes which are the same (e.g., nominally identical) or different, depending on the application.

In particular, the RF pump signals $P_1, \ldots, P_n$ which drive the respective mixing devices 130-1, . . . , 130-n have a same frequency $\omega_P$ which is a function of a difference between the center frequencies $\omega_C$ and $\omega'_C$ of the respective multipole bandpass filters. For example, in an exemplary embodiment, when $\omega_C > \omega'_C$, then $\omega_P = \omega_C - \omega'_C$, and when $\omega_C < \omega'_C$, then $\omega_P = \omega'_C - \omega_C$ (in general, $\omega_P = |\omega_C - \omega'_C|$). In addition, in the non-limiting exemplary embodiment shown in FIG. 1, the RF pump signal $P_1$ has a frequency of $\omega_P$ and a phase of θ, and the RF pump signal $P_n$ has a frequency of $\omega_P$ and a phase delay of θ+φ. In an exemplary embodiment, a total phase difference between the first and last RF pump signals $P_1$ and $P_n$ is about (or 90 degrees). For example, in a three-pole design (n=3) with three mixing devices, the RF pump signals $P_1$, $P_2$, and $P_3$ would have the same frequency of $\omega_P$ and respective incremental phase differences of approximately θ, $$\theta + \frac{\pi}{4},$$

and $$\theta + \frac{\pi}{2}.$$

In operation, the non-linear mixing devices 130 facilitate energy conversion (frequency conversion) between the signal passband $B_{Signal}$ and the idler passband $B_{Idler}$ to enable non-reciprocal transmission of signals between Port 1 and Port 2. For example, assume that the Josephson multipole multiband isolator circuit 100 is configured such that the second multipole bandpass filter 120 comprises the idler passband $B_{Idler}$ and that the first multipole bandpass filter 110 comprises the signal passband $B_{Signal}$. The non-linear mixing devices 130 can be driven to enable the unity transmission of power from Port 1 to the Port 2 ($S_{21}$) of the first multipole bandpass filter 110, while suppressing the transmission of power in the opposite direction from Port 2 to Port 1 ($S_{12}$). In this instance, the ports of the second multipole bandpass filter 120 can be cold terminated (e.g., 50-ohm termination) such as shown in FIG. 1, or open-ended, depending on the filter configuration.

More specifically, when driven with RF pump signals having a same frequency $\omega_P = |\omega_C - \omega'_C|$ and proper phase differences, the mixing devices 130-1, . . . , 130-n facilitate a frequency conversion of a microwave signal from the signal passband $B_{Signal}$ to the idler passband $B_{Idler}$, and back to the signal passband $B_{Signal}$ as the microwave signal propagates throughout the first and second multipole bandpass filters 110 and 120 such that energy traveling in the forward direction (e.g., $S_{21}$) will end up back at the carrier frequency yielding unity transmission, while energy travelling in the reverse direction ($S_{12}$) will be dispersed into the idler passband $B_{Idler}$ and terminated into matched loads. Essentially, as the microwave signal propagates between Port 1 and Port 2 through stages of the filter, phase differences are imposed on the signal that has been converted back to the original frequency. When the converted signal is mixed together with the unconverted signal, since the converted and unconverted signals have the same frequency and different phases, this serves to suppress the power transmission in one direction (e.g., $S_{12}$) via destructive interference, or combine together, in phase, via constructive interference to achieve unity transmission in the other direction (e.g., $S_{21}$).

It is to be noted that the Josephson multipole multiband isolator circuit 100 can implement four-wave mixing. In this instance, the frequency of the RF pump control signal would be a function of a difference between the center frequencies of the first and second multipole bandpass filters 110 and 120 as follows: $2\omega_P = |\omega_C - \omega'_C|$. In other words, the frequency of the RF pump control signal $\omega_P$ would be ½ of the difference of the center frequencies of the first and second multipole bandpass filters 110 and 120.

Moreover, while the exemplary embodiment of FIG. 1 (and other embodiments discussed herein) are described in the context of admittance inverting multipole bandpass filters, Josephson multipole multiband isolator circuits can be impedance inverting multipole bandpass filters that are implemented using impedance inverters instead of admittance inverters. In this regard, the exemplary Josephson multipole multiband isolator circuits as discussed herein can be implemented using immittance inverting multipole bandpass filters, wherein the terms "immittance inverting" or "immittance inverter" broadly denote terms such as admittance inverting, admittance inverter, impedance inverting, or impedance inverter.

It is to be understood that FIG. 1 illustrates an exemplary high-level architecture of an isolator circuit which includes filter circuitry that comprises a first port (e.g., Port 1), a second port (e.g., Port 2), a first bandpass filter (e.g., the first multipole bandpass filter 110), a second bandpass filter (e.g., the second multipole bandpass filter 120), and non-linear mixing devices (e.g., non-linear mixing devices 130) which are responsive to respective control signals (e.g., pump signals P1, . . . , $P_n$) to couple poles (e.g., shunt resonators 114) of the first bandpass filter to respective poles (e.g., shunt resonators 124) of the second bandpass filter to cause non-reciprocal transmission of signals from the first port to the second port. Various embodiments of Josephson multipole multiband isolator circuits can be implemented based on the general isolator architecture shown in FIG. 1.

Figure 2:
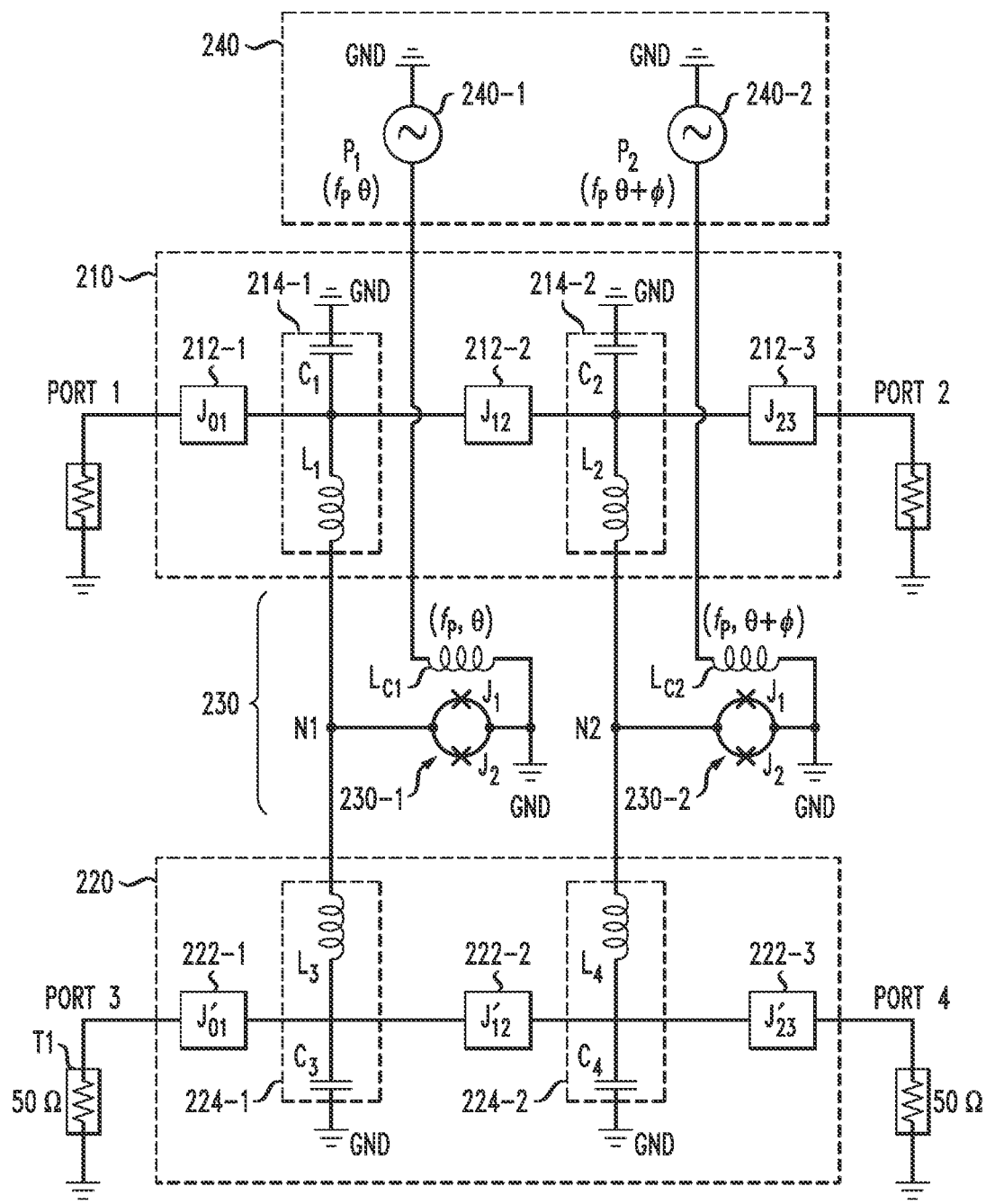
FIG. 2 schematically illustrates a Josephson multipole multiband isolator circuit, according to another exemplary embodiment of the disclosure.

For example, FIG. 2 schematically illustrates a Josephson multipole multiband isolator circuit, according to another exemplary embodiment of the disclosure. In general, FIG. 2 schematically illustrates a Josephson multipole multiband isolator circuit 200 which is based on the architecture of FIG. 1 wherein the mixing devices 130 of FIG. 1 are implemented using DC-SQUIDs. In particular, the Josephson multipole multiband isolator circuit 200 comprises a first multipole bandpass filter 210, a second multipole bandpass filter 220, and non-linear mixing devices 230 comprising a first DC-SQUID 230-1 and a second DC-SQUID 230-2. In addition, the Josephson multipole multiband isolator circuit 200 comprises circuitry for driving the non-linear mixing devices 230, including RF signal generator circuitry 240 comprising a first RF signal generator 240-1 and a second RF signal generator 240-2, and coupling inductors $L_{C_1}$ and $L_{C_2}$ which are disposed adjacent to the respective first and second DC-SQUIDs 230-1 and 230-2.

The first multipole bandpass filter 210 comprises an admittance inverting multipole bandpass filter network comprising a first port (Port 1), a second port (Port 2), a plurality of admittance inverters 212-1, 212-2, and 212-3 (generally, admittance inverters 212), and a plurality of shunt resonators 214-1 and 214-2 (generally, shunt resonators 214). The shunt resonators 214 comprise LC resonators, wherein the shunt resonator 214-1 comprises an inductor $L_1$ and a capacitor $C_1$, and the shunt resonator 214-2 comprises an inductor $L_2$ and a capacitor $C_2$. The admittance inverters 212 may be implemented using capacitive π-networks, inductive π-networks, and/or quarter-wavelength transmission lines.

The second multipole bandpass filter 220 comprises an admittance inverting multipole bandpass filter network comprising a third port (Port 3), a fourth port (Port 4), a plurality of admittance inverters 222-1, 222-2, and 222-3 (generally, admittance inverters 222), and a plurality of shunt resonators 224-1 and 224-2 (generally, shunt resonators 224). The shunt resonators 224 comprise LC resonators, wherein the shunt resonator 224-1 comprises an inductor $L_3$ and a capacitor $C_3$, and the shunt resonator 224-2 comprises an inductor $L_4$ and a capacitor $C_4$. The admittance inverters 222 may be implemented using capacitive π-networks, inductive π-networks, and/or quarter-wavelength transmission lines.

The first and second DC-SQUIDs 230-1 and 230-2 each comprise a first Josephson junction $J_1$ and a second Josephson junction $J_2$, which are connected in parallel to form a superconducting loop (referred to as SQUID loop) through which an external magnetic flux $\phi$ can be threaded to perform parametric mixing operations as discussed herein. Each DC-SQUID 230-1 and 230-2 effectively operates as a single Josephson junction with an effective critical current $I_{CS}$ and Josephson energy $E_{JS}$ which is tunable by inductively coupling a magnetic flux $\Phi$ to the SQUID loop. The Josephson junctions $J_1$ and $J_2$ have non-linear inductances, and may have the same, similar, or different critical currents.

As schematically illustrated in FIG. 2, the first DC-SQUID 230-1 is connected between a first node N1 and a ground node, and the second DC-SQUID 230-2 is connected between a second node N2 and the ground node. In addition, the inductors $L_1$ and $L_3$ of the respective shunt resonators 214-1 and 224-1 have terminals that are commonly coupled to the first node N1. Similarly, the inductors $L_2$ and $L_4$ of the respective shunt resonators 214-2 and 224-2 have terminals that are commonly coupled to second node N2. In this exemplary configuration, the shunt resonator 214-1 comprises an LC resonator in which the capacitor $C_1$ is coupled in parallel with an inductance formed by a series connection of the inductor $L_1$ and the inductance of the first DC-SQUID 230-1, and the shunt resonator 214-2 comprises an LC resonator in which the capacitor $C_2$ is coupled in parallel with an inductance formed by a series connection of the inductor $L_2$ and the inductance of the second DC-SQUID 230-2. Similarly, the shunt resonator 224-1 comprises an LC resonator in which the capacitor $C_3$ is coupled in parallel with an inductance formed by a series connection of the inductor $L_3$ and the inductance of the first DC-SQUID 230-1, and the shunt resonator 224-2 comprises an LC resonator in which the capacitor $C_4$ is coupled in parallel with an inductance formed by a series connection of the inductor $L_4$ and the inductance of the second DC-SQUID 230-2.

FIG. 2 schematically illustrates an exemplary 2-pole embodiment of the first and second multipole bandpass filters 210 and 220 wherein the first and second DC-SQUIDs 230-1 and 230-2 facilitate the coupling of the filter modes. The first and second DC-SQUIDs 230-1 and 230-2 are DC biased in a manner which allows each of the first and second multipole bandpass filters 210 and 220 to have respective bandpass filter responses with little or no crosstalk. On the other hand, when driven with RF pump signals with a phase difference, energy is converted from the signal passband $B_{Signal}$ to the idler passband $B_{Idler}$ and back from the idler passband $B_{Idler}$ to the signal passband $B_{Signal}$, with an effective phase difference that constructively combines the signals in one direction (in phase) and cancels the signals in the other direction (via destructive interference) when the signals are out of phase.

For example, as schematically shown in FIG. 2, the first RF signal generator 240-1 is configured to generate a first pump signal $P_1$ which is mutually coupled to the first DC-SQUID 230-1 through the coupling inductor $L_{C1}$. Similarly, the second RF signal generator 240-2 is configured to generate a second pump signal $P_2$ which is mutually coupled to the second DC-SQUID 230-2 through the second coupling inductor $L_{C2}$. In some embodiments, the first and second RF pump signals $P_1$ and $P_2$ which are applied to the first and second DC-SQUIDs 230-1 and 230-2 comprise RF current signals having a same pump frequency, $f_P$, but with a phase and/or amplitude difference. For example, as noted above, the pump frequency is selected as $f_P=|f_C-f'_C|$, where $f_C$ denotes a center frequency of the signal passband $B_{Signal}$ and where $f'_C$ denotes a center frequency of the idler passband $B_{Idler}$.

Moreover, in the exemplary 2-pole embodiment of FIG. 2, the first RF pump signal $P_1$ applied to the first DC-SQUID 230-1 has a phase $\theta$, while the second RF pump signal $P_2$ applied to the second DC-SQUID 230-2 has a phase $\theta+\phi$, where in an exemplary embodiment, $$\phi \cong \frac{\pi}{2}.$$

In some embodiments, the phase difference between the first and second RF pump signals $P_1$ and $P_2$ is achieved by the first and second RF signal generators 240-1 and 240-2 being synchronized to generate the first and second RF pump signals $P_1$ and $P_2$ with a phase delay, and transmitting the first and second RF pump signals $P_1$ and $P_2$ to the coupling inductors $L_{C1}$ and $L_{C2}$ over their respective transmission lines.

It is to be noted that while the phase difference between the pump signals $P_1$ and $P_2$ can be $$\phi \cong \frac{\pi}{2},$$

the phase difference can vary depending on how the Josephson multipole multiband isolator circuit is designed, e.g., number of poles of the bandpass filters, the values of the admittance inverters, the resonant frequencies of the shunt resonators between the admittance inverters, etc. The phase differential can vary depending on desired margins, performance, etc. While FIG. 2 illustrates a 2-pole design, as noted above, for a 3-pole design, the phase difference between three RF pump signals applied to three respective mixing devices can be, e.g., ~0°, ~45°, and ~90°. In an exemplary 4-pole design, the phase difference between four RF pump signals applied to four respective mixing devices can be, e.g., ~0°, ~30°, ~60°, and ~90°.

Figure 3:
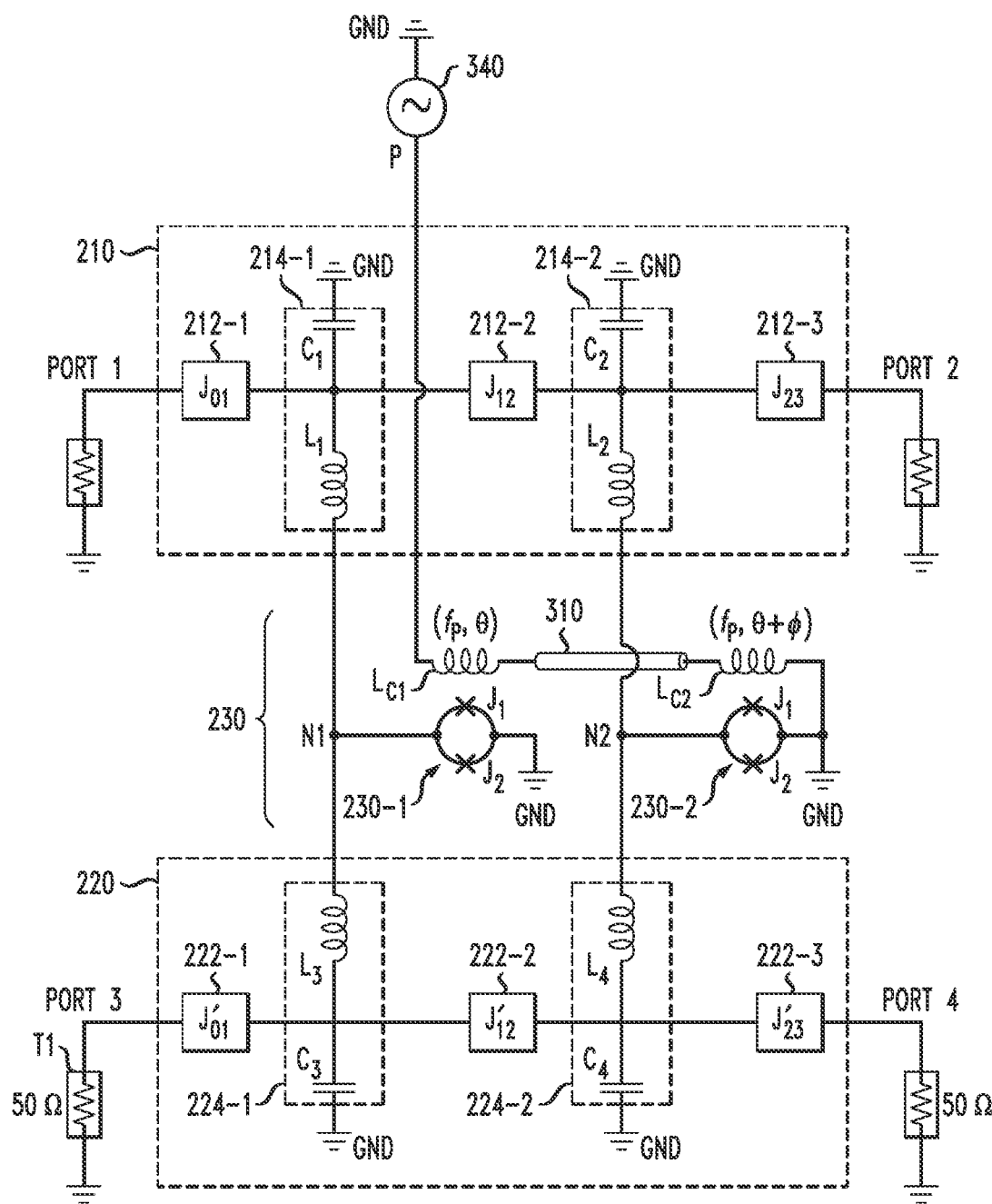
FIG. 3 schematically illustrates a Josephson multipole multiband isolator circuit, according to another exemplary embodiment of the disclosure.

FIG. 3 schematically illustrates a Josephson multipole multiband isolator circuit, according to another exemplary embodiment of the disclosure. In general, FIG. 3 schematically illustrates a Josephson multipole multiband isolator circuit 300 which is similar in architecture to the Josephson multipole multiband isolator circuit 200 of FIG. 2, except that the Josephson multipole multiband isolator circuit 300 comprises transmission line 310 having one end coupled to the first coupling inductor $L_{C1}$ and another end coupled to the second coupling inductor $L_{C2}$, and a single RF signal generator 340 to generate an RF pump signal P (with frequency $f_P$) which is utilized to drive the first and second DC-SQUIDS 230-1 and 230-2. In this configuration, the transmission line 310 has an electrical/physical length (based on the frequency $f_P$) which imparts a desired phase difference of the RF pump signal P at the first and second coupling inductors $L_{C1}$ and $L_{C2}$, e.g., phase $\theta$ at $L_{C1}$ and phase $\theta+\phi$ at $L_{C2}$. This configuration allows the use of one common RF signal generator 340 and one RF pump I/O line to extend through a cryostat to the Josephson multipole multiband isolator circuit 300 to feed a single RF pump signal to drive all non-linear mixing devices 230 (which can be two or more) coupled to different points along the transmission line 310. Indeed, with a pump frequency $f_P$ on the order of GHz (e.g., 2 GHz, 4 GHz, etc.), the electrical length of the transmission line 310 is small enough to be fabricated "on chip" to reduce RF pump signal I/O overhead.

Figure 4A:
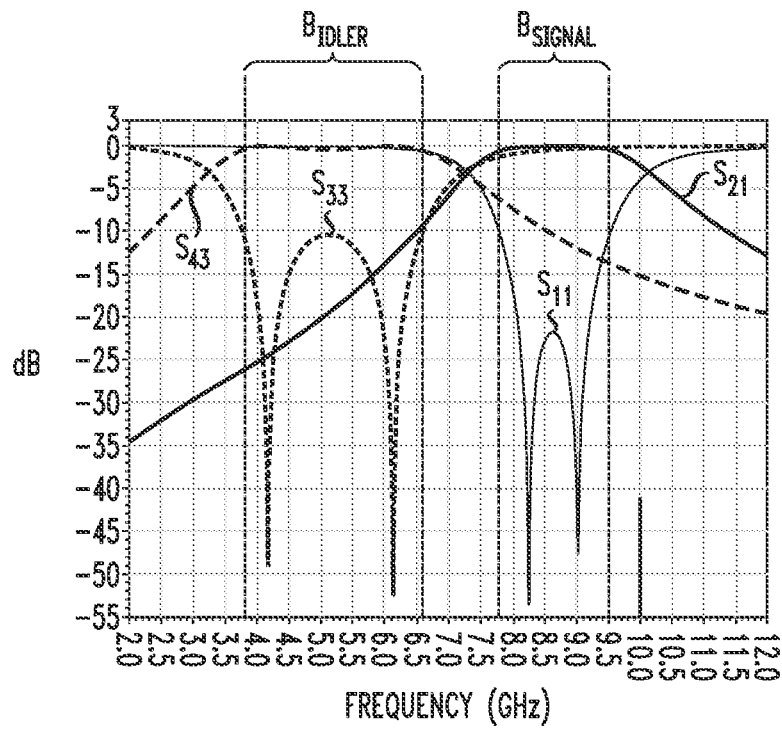
FIGS. 4A, 4B, 4C, and 4D schematically illustrate scattering parameters of a Josephson multipole multiband isolator circuit, according to exemplary embodiments of the disclosure.

FIGS. 4A, 4B, 4C and 4D illustrate simulated scattering parameter waveforms of a Josephson multipole multiband isolator circuit, according to exemplary embodiments of the disclosure. More specifically, FIGS. 4A, 4B, 4C and 4D depict simulated scattering parameter waveforms that show exemplary modes of operation of a Josephson multipole multiband isolator circuit comprising an exemplary architecture such as depicted in FIG. 2. For illustrative purposes, as shown in FIG. 4A it is assumed that the first multipole bandpass filter 210 comprises the signal (S) band having a signal passband $B_{Signal}$ from about 7.75 GHz to about 9.5 GHz, and that the second multipole bandpass filter 220 comprises the idler (I) band having an idler passband $B_{Idler}$ from about 3.75 GHz to about 6.25 GHz, which is non-overlapping with the signal passband $B_{Signal}$. It is to be noted that the illustrated bandwidths for the signal passband $B_{Signal}$ and the idler passband $B_{Idler}$ are defined by equi-ripple points of the respective filter passbands (and not 3 dB points).

Figure 4B:
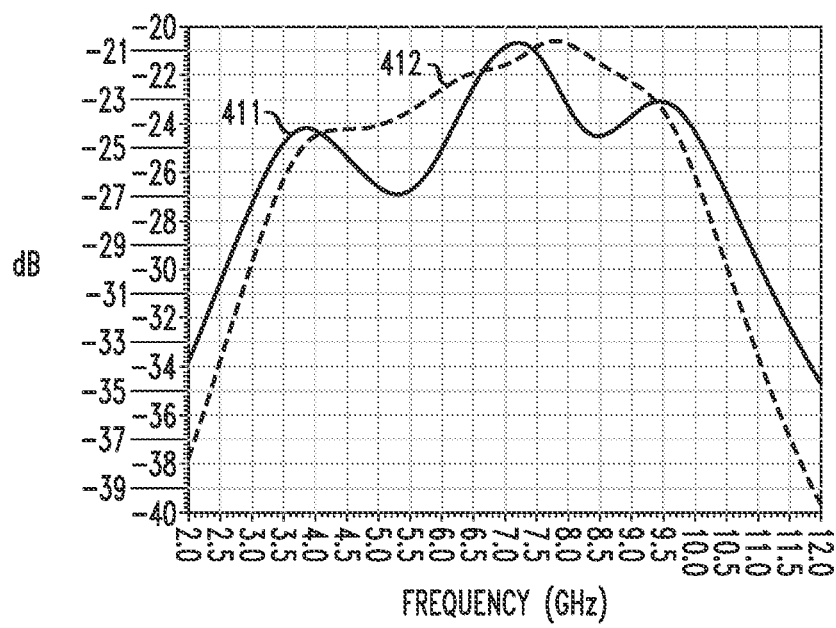

FIGS. 4A and 4B illustrate the linear scattering characteristics of the Josephson multipole multiband isolator circuit 200 with each of the first and second DC-SQUIDs 230-1 and 230-2 flux biased with a DC flux bias (DC at approximately one-half the magnetic flux quantum $\Phi_0$, where $\Phi_0=h/(2e)\approx2.07\times10^{-15}$ weber and, in particular, $\Phi_{DC}\approx0.45$ $\Phi_0$, but with no RF flux bias $\Phi_{RF}$ applied (via the RF pump signals $P_1$ and $P_2$) applied to the first and second DC-SQUIDs 230-1 and 230-2. It is to be noted that the value of the DC flux bias $\Phi_{DC}$ will vary depending on the architecture and parameter values of the Josephson multipole multiband isolator circuit.

FIG. 4A illustrates simulated waveforms 400 of scattering parameters $S_{11}$, $S_{21}$, $S_{33}$, and $S_{43}$ in terms of power in dB (y-axis) as a function of frequency in GHz (x-axis). FIG. 4A illustrates that the power transmission ($S_{21}$) from Port 1 to Port 2 is near unity in the signal passband $B_{Signal}$ with a low reflection loss ($S_{11}$) at Port 1. In addition, FIG. 4A illustrates that the power transmission ($S_{43}$) from Port 3 to Port 4 is near unity in the idler passband $B_{Idler}$ with a low reflection loss ($S_{33}$) at Port 3. The simulated waveforms of FIG. 4A illustrate that a proper DC biasing of the first and second DC-SQUIDs 230-1 and 230-2 results in operation of two independent bandpass filters with disparate passbands, wherein the bandpass filters are well matched with 10-15 dB in-band rejection.

Next, FIG. 4B illustrates simulated waveforms 410 of scattering parameters $S_{31}$, $S_{32}$, $S_{41}$, and $S_{42}$ in terms of power in dB (y-axis) as a function of frequency in GHz (x-axis). In particular, a simulated waveform 411 in FIG. 4B represents both the (i) power transmission from Port 2 to Port 3 ($S_{32}$), and the (ii) power transmission from Port 1 to Port 4 ($S_{41}$). In addition, a simulated waveform 412 represents both the (i) power transmission from Port 1 to Port 3 ($S_{31}$), and the (ii) power transmission from Port 2 to Port 4 ($S_{42}$). The simulated waveforms 411 and 412 of FIG. 4B illustrate that a proper DC biasing of the first and second DC-SQUIDs 230-1 and 230-2 results in significantly low crosstalk between the first and second multipole bandpass filters 210 and 220 (e.g., crosstalk suppression better than 20 dB). FIG. 4B illustrates that a proper DC biasing of the first and second DC-SQUIDs 230-1 and 230-2 results in good crosstalk suppression between the first and second multipole bandpass filters 210 and 220.

Figure 4C:
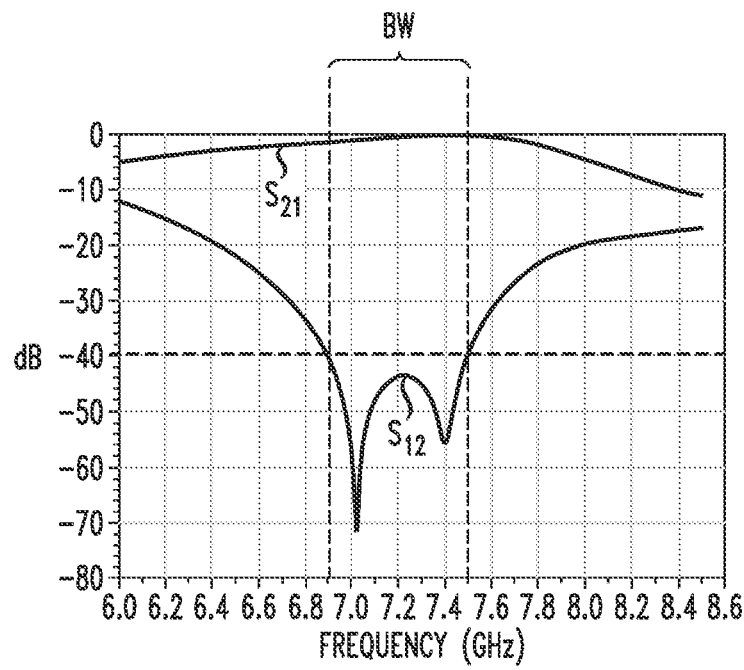
Figure 4D:
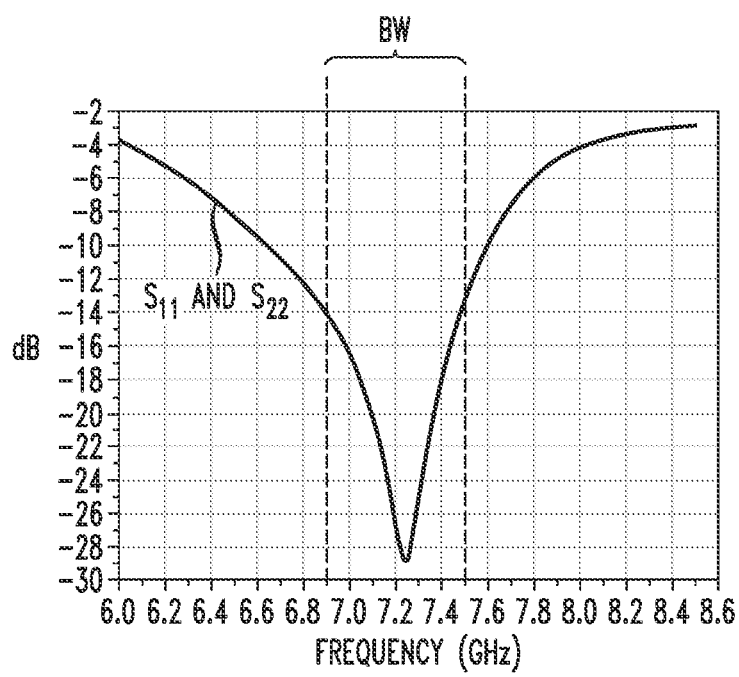

Next, FIGS. 4C and 4D illustrate scattering characteristics of the Josephson multipole multiband isolator circuit 200 with each of the first and second DC-SQUIDs 230-1 and 230-2 flux biased with the DC flux bias $\Phi_{DC}$ (as noted above), in addition to a RF flux bias $\Phi_{RF}$ applied to each of the first and second DC-SQUIDs 230-1 and 230-2 via RF pump signals $P_1$ and $P_2$ with the same frequency but with different phases. For example, in an exemplary embodiment, the RF pump signals $P_1$ and $P_2$ applied to the respective first and second DC-SQUIDs 230-1 and 230-2 have a frequency of 4 GHz, and a phase difference of about 90°. FIG. 4C illustrates simulated waveforms 420 of the scattering parameters $S_{21}$ and $S_{12}$ in terms of power in dB (y-axis) as a function of frequency in GHz (x-axis), and FIG. 4D illustrates simulated waveforms 430 of the scattering parameters $S_{11}$ and $S_{22}$ in terms of power in dB (y-axis) as a function of frequency in GHz (x-axis), In particular, FIG. 4C illustrates that when proper RF pump signals are applied to the first and second DC-SQUIDs 230-1 and 230-2, the power transmission ($S_{21}$) from Port 1 to Port 2 is near unity over a given bandwidth of about 600 MHz (denoted BW) comprising a range of signal frequencies from about 6.9 GHz to about 7.5 GHz, while the power transmission ($S_{12}$) from Port 2 to Port 1 within the given BW is highly suppressed, e.g., −40 dB or more. In addition, FIG. 4D illustrates overlapping waveforms of the reflection coefficients $S_{11}$ and $S_{22}$ at ports Port 1 and Port 2 respectively, wherein $S_{11}$ and $S_{22}$ are less than −15 dB within the given bandwidth BW. In this regard, FIG. 4C shows that the Josephson multipole multiband isolator circuit 200 can provide unity transmission in one direction (e.g., from Port 1 to Port 2), while providing high isolation the opposite direction, <−40 dB (e.g., from Port 2 to Port 1). In addition, the matching of $S_{11}$ and $S_{22}$ in FIG. 4D shows that the Josephson multipole multiband isolator circuit is well matched in band. It is to be noted that the unmodulated signal filter passband $B_{Signal}$ as shown in FIG. 4A (e.g., 7.75-9.5 GHz) is different from the isolated band BW shown in FIGS. 4C and 4D. The reason is that the modulated signal filter passband slightly decreases in frequency due to the modulation.

It is to be noted that the exemplary Josephson multipole multiband isolator circuits as discussed herein (e.g., the Josephson multipole multiband isolator circuit 200, FIG. 2) provide various advantages. For example, when properly configured and optimized for bandwidth and directionality, the exemplary Josephson multipole multiband isolator circuits can readily replace conventional commercial ferrite-based isolators, thereby reducing cost and footprint in both the control and readout chains of a quantum computing system. Indeed, the exemplary Josephson multipole multiband isolator circuits as disclosed herein provide a nonmagnetic solution to isolation and can be disposed in relatively close proximity to a quantum processor and/or integrated therewith. Indeed, the exemplary Josephson multipole multiband isolator circuits can be readily fabricated on integrated circuit chips and having a smaller footprint and weight, as compared to discrete passive microwave isolation components. Again, the electrical characteristics of Josephson multipole multiband isolator circuits are similar to passive ferrite-based isolators.

In addition, the exemplary Josephson multipole multiband isolator circuits as discussed herein, which implement at least two multipole bandpass filters, provide various advantages to Josephson isolator circuits which can be implemented using a single multipole bandpass filter. Indeed, a Josephson isolator circuit can be constructed using a single bandpass filter circuit with two or more poles that are implemented by shunt LC resonators having non-linear inductances provided by DC-SQUIDs, wherein the DC-SQUIDS can be driven by RF pump signals with different phases to enable 3-wave mixing. By varying the phase of the pumps to each DC-SQUID of each LC pole of the single bandpass filter, the microwave energy applied to the input port can be modulated from and back to the signal band to get near unity transmission while energy applied to the output port would be 3-wave mixed out of band of the filter and reflected away resulting in asymmetric transmission. However, by adding a second bandpass filter with a non-degenerate passband, the exemplary Josephson multipole multiband isolator circuits as disclosed herein provide multiple advantages over Josephson isolator circuits that are implemented using a single bandpass filter.

For example, as compared to a Josephson isolator circuit having a single bandpass filter, an exemplary Josephson multipole multiband isolator circuit having a multi-bandpass filter architecture exhibits less insertion loss and greater directionality. This is due to the fact that with a single bandpass filter architecture, one deleterious effect is that wanted energy is reflected out of the filter resulting in greater insertion loss. With the addition of a second filter, the energy can be prevented from being reflected away by preferentially mixing such energy into the band of the second coupled filter. In addition, a Josephson multipole multiband isolator circuit having a multi-bandpass filter exhibits greater isolation due to the fact that more signal remains in the filter to be 3-wave mixed. For example, as shown in FIG. 4C, when the RF pump signals are applied to the DC-SQUIDS, an isolation (e.g., $S_{12}$) of −40 dB or more is achieved over a 600 MHz frequency band, and at near unity transmission (e.g., $S_{21}$) in the same band. Furthermore, when the admittance inverters in FIGS. 2 and 3 are implemented using capacitors (as opposed to, e.g., 50 Ohm transmission lines), simulations have shown that an isolation (e.g., $S_{12}$) −60 dB can be achieved in-band, which is at least three times more isolation than can be achieved by a single junction magnetic ferrite isolator. On the other hand, a Josephson isolator circuit having a single bandpass filter architecture can realize an insertion loss (e.g., e.g., $S_{21}$) of about 3 to 4 dB, and a much smaller bandwidth over which high isolation is achieved.

Further, as compared to a Josephson isolator circuit having a single multipole passband filter with mixing devices, a Josephson multipole multiband isolator circuit architecture allows each bandpass filter to be designed with a smaller number of poles, thereby realizing a smaller overall footprint and small number of RF pump I/O lines to each Josephson multipole multiband isolator circuit in the cryostat. For example, a Josephson multipole multiband isolator circuit comprising a 2-pole multi-bandpass filter can achieve higher performance as compared to a Josephson isolator circuit having a single bandpass filter with, e.g., 3 shunt LC poles or more. In addition to achieving much larger directionality, an exemplary Josephson multipole multiband isolator circuit having a multi-bandpass filter architecture provides flexibility in the design with regard to the pump frequency, and amplitudes of the RF pump signals.

In particular, a Josephson multipole multiband isolator circuit with a multi-bandpass filter architecture allows the bandpass filters to be designed with disparate, non-overlapping passbands, wherein the RF pump signal can have a pump frequency which is a function of the center frequencies of the disparate, non-overlapping passbands, while the pump frequency is outside the passbands. For example, as noted above, the RF pump frequency can be selected as $f_P=|f_C-f'_C|$, where $f_C$ denotes a center frequency of the signal passband $B_{Signal}$ and where $f'_C$ denotes a center frequency of the idler passband $B_{Idler}$. If a given Josephson multipole multiband isolator circuit is to be constructed and operated using a RF pump frequency of 2 GHz and a center frequency $f_C$ of 8 GHz for the signal passband $B_{Signal}$, then idler bandpass filter can be constructed with a center frequency $f'_C$ of 6 GHz or 10 GHz, as desired. As such, the idler passband filter can be configured to allow a signal to be converted with any suitable and desired RF pump frequency. In contrast, with a Josephson isolator circuit having a single bandpass filter with mixing devices, the RF pump frequency is limited in flexibility because the idler frequency must be within the signal passband of the bandpass filter. This limits the RF pump tones that can be utilized, because the idler frequencies must be able pass through the passband of the bandpass filter. Advantageously, the addition of the idler bandpass filter provides latitude in the RF pump frequency that can be utilized for reasons as discussed above.

Figure 5:
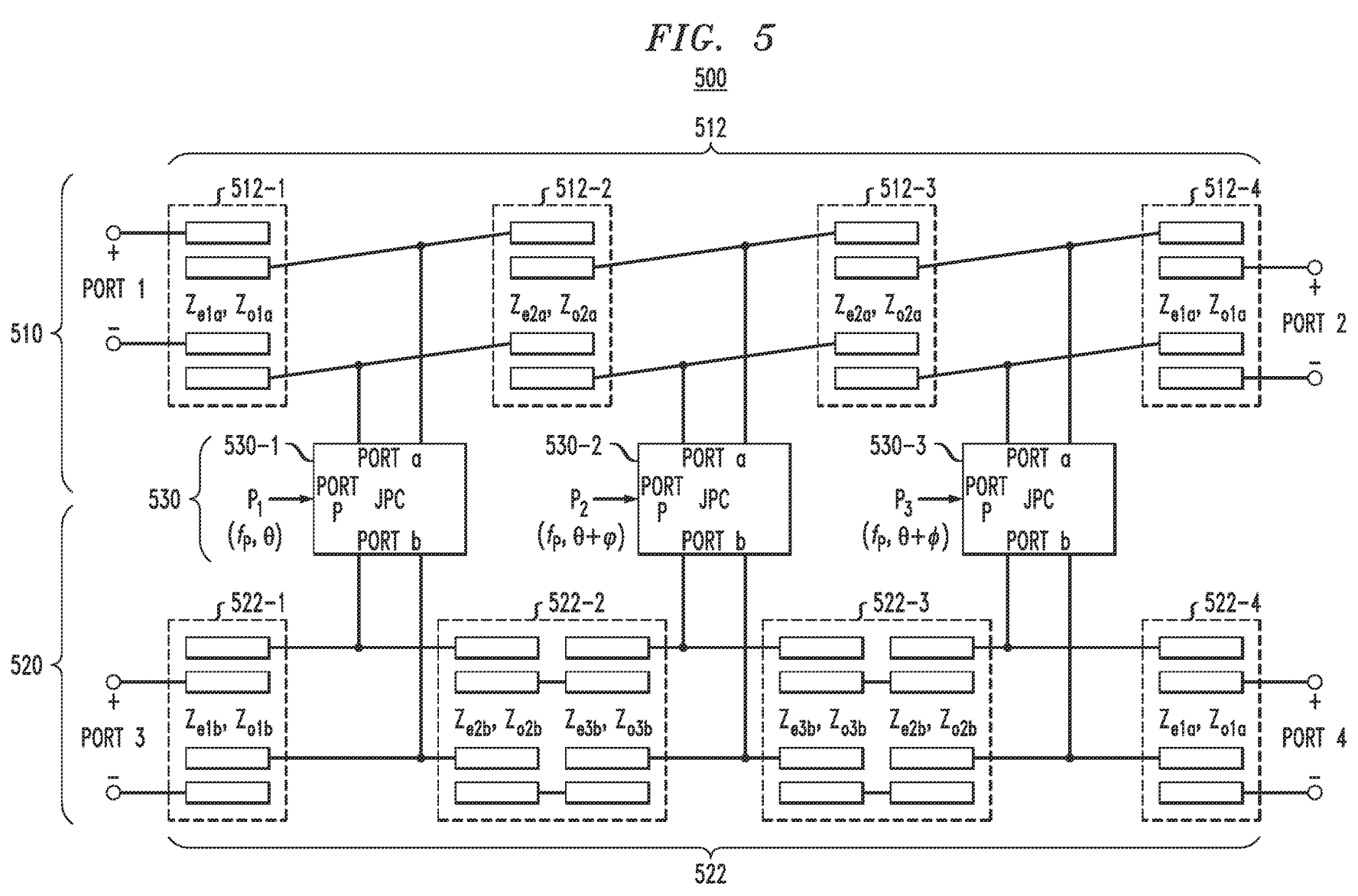

FIG. 5 schematically illustrates a Josephson multipole multiband isolator circuit, according to another exemplary embodiment of the disclosure. More specifically, FIG. 5 schematically illustrates a differential Josephson multipole multiband isolator circuit 500 comprising first and second immittance inverting multipole bandpass filter networks 510 and 520 which are constructed using respective coupled transmission lines 512 and 522 as immittance inverters, and non-linear mixing devices 530 which are implemented using Josephson parametric converters 530-1, 530-2, and 530-3. The Josephson parametric converters 530-1, 530-2, and 530-3 implement the LC resonators of the first and second immittance inverting multipole bandpass filter networks 510 and 520, and perform mixing functions as discussed herein.

FIG. 5 schematically illustrates a 3-pole architecture of the first immittance inverting multipole bandpass filter network 510 (having a signal passband $B_{Signal}$) and a 3-pole architecture of the second immittance inverting multipole bandpass filter network 520 (having an idler passband $B_{Idler}$), wherein the filter poles are provided by the three Josephson parametric converters 530-1, 530-2, and 530-3. The coupled transmission lines 512 comprise coupled transmission lines 512-1, 512-2, 512-3, and 512-4 which are configured as immittance inverters for the first immittance inverting multipole bandpass filter network 510, and the coupled transmission lines 522 comprise coupled transmission lines 522-1, 522-2, 522-3, and 522-4 which are configured as immittance inverters for the second immittance inverting multipole bandpass filter network 520. The coupled transmission lines 512-1, 512-2, 512-3, and 512-4 are defined by their even and odd modes. Similarly, the coupled transmission lines 522-1, 522-2, 522-3, and 522-4 are defined by their even and odd modes.

Each Josephson parametric converter 530-1, 530-2, and 530-3 comprises a first differential port (denoted Port a), a second differential port (denoted Port b), and a pump port (denoted Port P). In the exemplary embodiment shown in FIG. 5, it is assumed that the first immittance inverting multipole bandpass filter network 510 comprises a signal passband $B_{Signal}$, and that the second immittance inverting multipole bandpass filter network 520 comprises an idler passband $B_{Idler}$. Further, as schematically shown in FIG. 5, the differential ports (Port a) of the Josephson parametric converters 530-1, 530-2, and 530-3 are coupled to the coupled transmission lines 512, and the differential ports (Port b) of the Josephson parametric converters 530-1, 530-2, and 530-3 are coupled to the coupled transmission lines 522.

In particular, the differential Port a of the Josephson parametric converter 530-1 is coupled to positive and negative input/output nodes between the coupled transmission lines 512-1 and 512-2, and the differential Port b of the Josephson parametric converter 530-1 is coupled to positive and negative input/output nodes between the coupled transmission lines 522-1 and 522-2. Moreover, the differential Port a of the Josephson parametric converter 530-2 is coupled to positive and negative input/output nodes between the coupled transmission lines 512-2 and 512-3, and the differential Port b of the Josephson parametric converter 530-2 is coupled to positive and negative input/output nodes between the coupled transmission lines 522-2 and 522-3. The differential Port a of the Josephson parametric converter 530-3 is coupled to positive and negative input/output nodes between the coupled transmission lines 512-3 and 512-4, and the differential Port b of the Josephson parametric converter 530-3 is coupled to positive and negative input/output nodes between the coupled transmission lines 522-3 and 522-4. This configuration allows the positive transmission lines of the signal (S) band to be coupled to the negative transmission lines of the idler (I) band, and vice versa, through the Josephson parametric converters 530-1, 530-2, and 530-3.

As further shown in FIG. 5, the Josephson parametric converters 530-1, 530-2, and 530-3 are driven by respective RF pump signals $P_1$, $P_2$, and $P_3$, which have a same frequency $f_P$ but different phases $\theta$, $\theta+\varphi$, and $\theta+\phi$, respectively. Assuming the differential Josephson multipole multiband isolator circuit 500 is configured for unity transmission of power from port P1 to port P2 ($S_{21}$) and suppression of power from Port 2 to Port 1 ($S_{12}$), with Port 3 and Port 4 cold terminated or open ended, the respective phases can be, e.g., $\theta \cong 0°$, $\theta+\varphi \cong 90°$, and $\theta+\phi \cong 180°$. As noted above, changing the phases of the RF pump signals can enable transmission and isolation in the other direction.

The exemplary configuration shown in FIG. 5 comprises a differential filter architecture for implementing the first and second immittance inverting multipole bandpass filter networks 510 and 520 by constructing different sections of coupled transmission lines to connect the non-linear filter poles (e.g., LC resonators) that are provided by the Josephson parametric converters 530-1, 530-2, and 530-3. It is to be understood that the Josephson parametric converters 530-1, 530-2, and 530-3 can be implemented using any suitable architecture which is sufficient to provide filter poles (e.g., LC poles) for the first and second immittance inverting multipole bandpass filter networks 510 and 520, and to implement the mixing functions as discussed herein to achieve non-reciprocal transmission and isolation.

Figure 6:
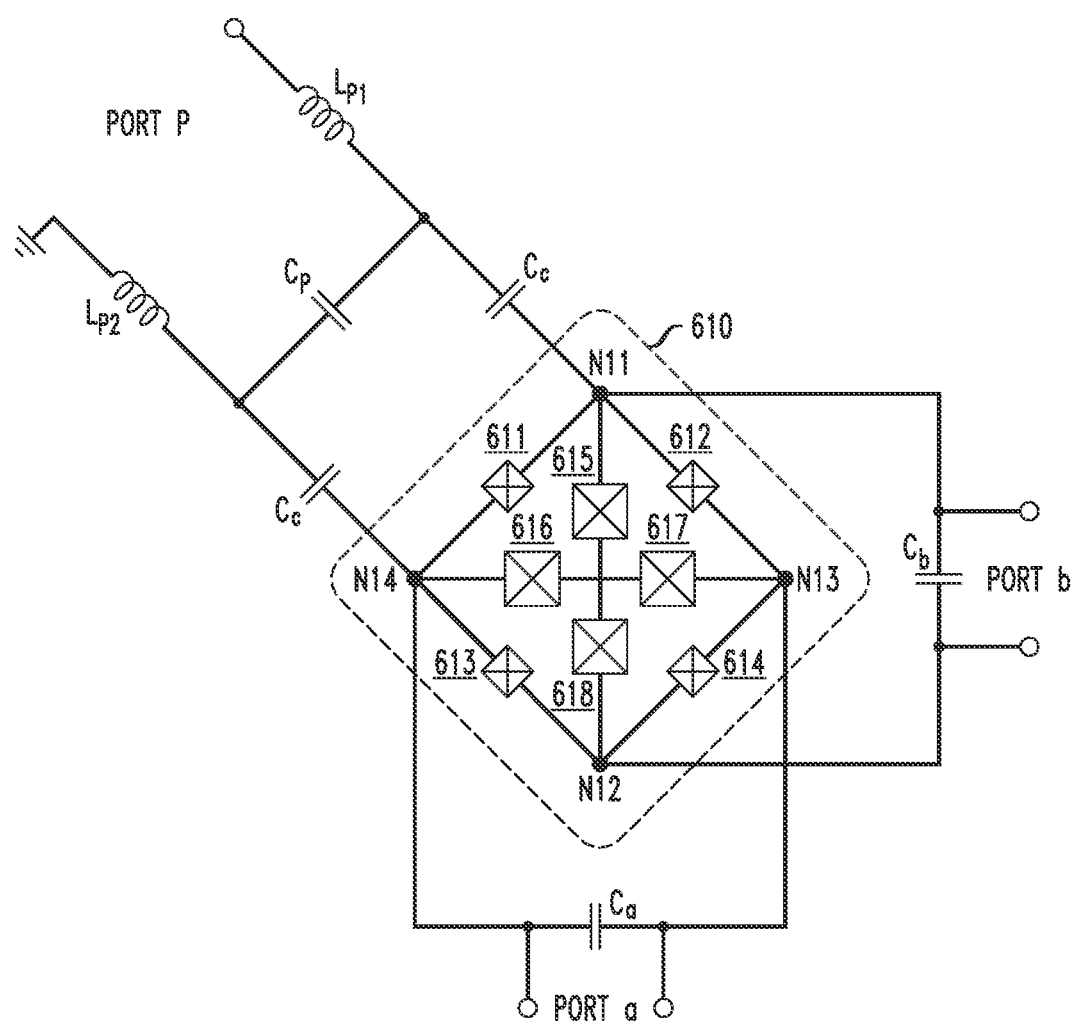
FIG. 6 schematically illustrates a superconducting Josephson parametric converter which can be utilized to implement three-wave mixing devices of the Josephson multipole multiband isolator circuit of FIG. 5, according to an exemplary embodiment of the disclosure.

For example, FIG. 6 schematically illustrates a Josephson parametric converter 600 which can be utilized to implement the differential Josephson multipole multiband isolator circuit of FIG. 5, according to an exemplary embodiment of the disclosure. The Josephson parametric converter 600 comprises three ports which are denoted Port a, Port b, and Port P, a Josephson ring modulator (JRM) 610, capacitors $C_a$, $C_b$, $C_c$, and $C_P$, and inductors $L_{P1}$ and $L_{P2}$. The JRM 610 is a nonlinear element that is configured to perform three-wave mixing of microwave signals at the quantum limit. The JRM 610 comprises four outer Josephson junctions 611, 612, 613, and 614 arranged in a configuration which forms an outer loop with nodes N11, N12, N13, and N14, and four inner Josephson junctions 615, 616, 617, and 618.

The Josephson parametric converter 600 has three eigenmodes: two differential resonant modes and one common mode. The two differential resonant modes include a signal (S) resonant mode (or a mode), and an idler (I) resonant mode (or b mode). For example, in the exemplary embodiment shown in FIG. 6, in a nondegenerate embodiment, the Josephson parametric converter 600 supports two differential resonance modes with different frequencies, e.g., a first frequency $f_a$ that is associated with the signal (S) mode, and a second frequency $f_b$ that is associated with the idler (I) mode. In general, the capacitor $C_a$ and the JRM 610 provide a resonant mode (signal mode), and are configured to implement a shunt LC pole of a first immittance inverting multipole bandpass filter, e.g., the first immittance inverting multipole bandpass filter network 510 of FIG. 5. The capacitor $C_b$ and the JRM 610 provide a resonant mode b (idler mode), and are configured to implement a shunt LC pole of a second immittance inverting multipole bandpass filter, e.g., the second immittance inverting multipole bandpass filter network 520 of FIG. 5. In this exemplary configuration, the Josephson parametric converter 600 provides two LC resonators (poles), one LC resonator for the signal (S) bandpass filter and another LC resonator for the idler (I) bandpass filters, which are coupled together through the JRM 610, similar to the embodiments shown in FIGS. 2 and 3, for example, where two LC resonators are coupled together through a DC-SQUID.

An RF pump signal with frequency $f_P$ is applied to the Port P and gives rise to a common mode excitation of the JRM 610 which leads to 3-wave mixing of signals at Port a, Port b, and Port P. The JRM 610 is configured to perform nondegenerate mixing in the microwave regime without losses, and can achieve quantum-limited noise performance as a mixer. The differential Port P is coupled to nodes N11 and N14 of the Josephson parametric converter 600 to enable common mode excitation of the JRM 610, as is understood by those of ordinary skill in the art. A DC flux bias is applied through the JRM 610 and RF pump signal can be applied to the Port P to bias the JRM 610 and to excite the JRM 610 to perform mixing functions as discussed herein. It is to be understood that the Josephson parametric converter 600 is merely an exemplary embodiment, and that other suitable Josephson parametric converter circuit architectures can be used to construct a Josephson multipole multiband isolator circuit, such as shown in FIG. 6. In addition, while the Josephson parametric converter 600 shown in FIG. 6 can be utilized for a differential bandpass filter architecture as shown in FIG. 5, the Josephson parametric converter 600 can also be utilized for a single-ended filter architecture, whereby each of the input ports, Port a and Port b, is coupled to a 180-degree hybrid coupler, with one input terminal having a cold termination.

Figure 7:
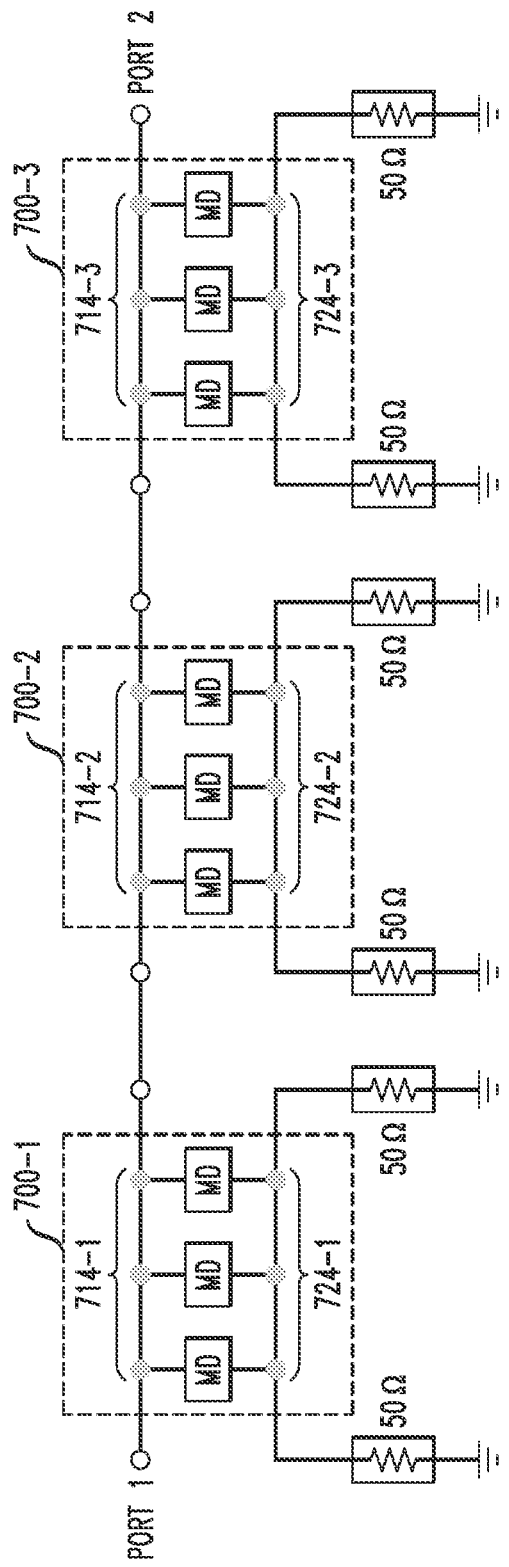
FIG. 7 schematically illustrates a Josephson multipole multiband isolator circuit, according to another exemplary embodiment of the disclosure.

FIG. 7 schematically illustrates a Josephson multipole multiband isolator circuit, according to another exemplary embodiment of the disclosure. More specifically, FIG. 7 schematically illustrates a cascading Josephson multipole multiband isolator circuit 700 which is formed by cascading a plurality of individual Josephson multipole multiband isolator circuit blocks. FIG. 7 shows an exemplary embodiment of the cascading Josephson multipole multiband isolator circuit 700 having a succession of three individual Josephson multipole multiband isolator stages 700-1, 700-2, and 700-3 coupled between a first port (Port 1) and a second port (Port 2). The Josephson multipole multiband isolator stage 700-1 comprises a first immittance inverting multipole bandpass filter comprising three shunt resonators 714-1, a second immittance inverting multipole bandpass filter comprising three shunt resonators 724-1, and a three mixing devices MD coupling the respective filter modes. The Josephson multipole multiband isolator stage 700-2 comprises a first immittance inverting multipole bandpass filter comprising three shunt resonators 714-2, a second immittance inverting multipole bandpass filter comprising three shunt resonators 724-2, and three mixing devices MD coupling the respective filter modes. The Josephson multipole multiband isolator stage 700-3 comprises a first immittance inverting multipole bandpass filter comprising three shunt resonators 714-3, a second immittance inverting multipole bandpass filter comprising three shunt resonators 724-3, and three mixing devices MD coupling the respective filter modes.

In the exemplary embodiment of FIG. 7, it is assumed that the first immittance inverting multipole bandpass filters are configured as the signal (S) bandpass filters, and that the second immittance inverting multipole bandpass filters are configured as the idler (I) bandpass filters. In this configuration, all input/output ports of the second immittance inverting multipole bandpass filters are terminated with a 50 Ohm termination, while the input/output ports of the first immittance inverting multipole bandpass filters are connected as schematically shown in FIG. 7 to provide a single input port (Port 1) and a single output port (Port 2). Each of the Josephson multipole multiband isolator stages 700-1, 700-2, and 700-3 can be implemented using any of the exemplary Josephson multipole multiband isolator circuit embodiments as shown, for example, in FIGS. 2, 3, 5, and 6. The cascading Josephson multipole multiband isolator circuit architecture increases the overall isolation (e.g., $S_{12}$). For example, if each Josephson multipole multiband isolator stage 700-1, 700-2, and 700-3 provides 20 dB or greater of isolation, the entire cascading Josephson multipole multiband isolator circuit 700 can provide 60 dB or greater of isolation.

Figure 8:
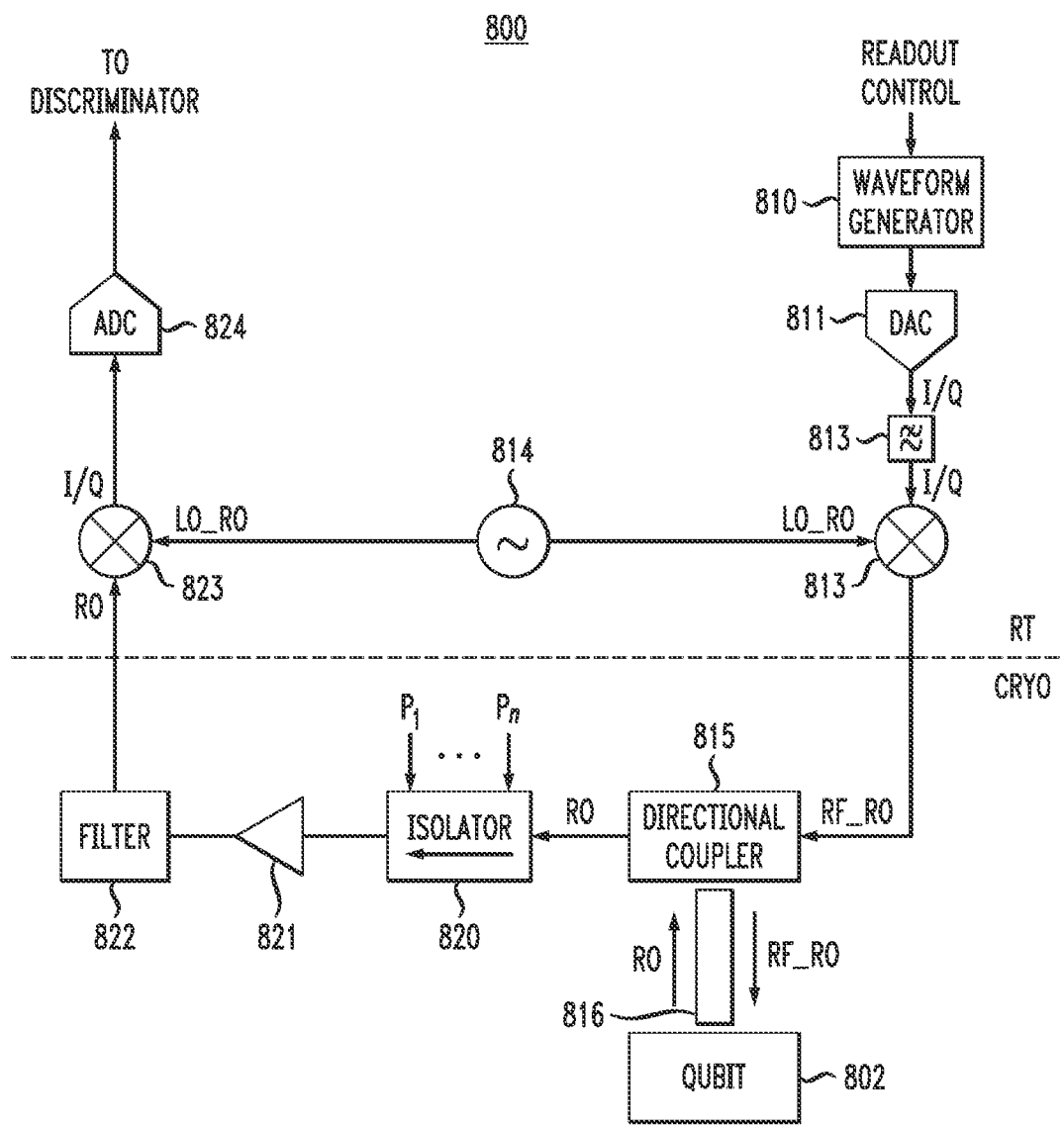
FIG. 8 schematically illustrates readout circuitry of a quantum processing system, which can implement Josephson multipole multiband isolator circuits in qubit readout signal paths to provide isolation, according to an exemplary embodiment of the disclosure.

FIG. 8 schematically illustrates readout circuitry of a quantum processing system, which can implement Josephson multipole multiband isolator circuits in qubit readout signal paths to provide isolation, according to an exemplary embodiment of the disclosure. More specifically, FIG. 8 schematically illustrates qubit readout control circuitry 800 of a quantum computing system which is configured to readout a quantum state of at least one superconducting qubit 802. The qubit readout control circuitry 800 is configured to generate an RF readout control signal (RF_RO) to readout the state of the superconducting qubit 802 using a dispersive readout scheme which enables a quantum non-demolition measurement of the state of the superconducting qubit 802 to preserve the state of the superconducting qubit 802. In an exemplary embodiment, the qubit readout control circuitry 800 receives and processes readout control signals from a control process.

The qubit readout control circuitry 800 comprises a waveform generator 810 (or pulse envelope generator), digital-to-analog (DAC) circuitry 811, low-pass filter circuitry 812, a first I/Q mixer 813 (upconverter mixer), an local oscillator (LO) signal generator 814, a directional coupler 815, a readout resonator 816, and a readout signal chain which comprises a Josephson multipole multiband isolator circuit 820, a quantum-limited amplifier 821, a filter 822 a second I/Q mixer 823, and analog-to-digital converter (ADC) circuitry 824, which outputs digital readout signals to a hardware or software based discriminator to determine a readout state of the superconducting qubit 802.

The waveform generator 810 is configured to generate digital I and Q signals with a given type of pulse envelope (e.g., Gaussian square pulse envelope) for qubit state readout, in response to a readout control signal. The DAC circuitry 811 is configured to convert the digital I and Q pulses into analog I and Q control pulses which are filtered by the low-pass filter circuitry 812. The filtered analog control I and Q control pulses are applied to the I/Q mixer 813, along with an LO signal (LO_RO) that is generated by the LO signal generator 814, to generate an RF readout control pulse RF_RO. In particular, the I/Q mixer 813 is configured mix the analog I and Q control pulses with the LO_Q signals of a given LO frequency (e.g., 7 GHz) to perform I/Q modulation and upconversion and/or downconversion using known techniques (e.g., single sideband modulation) to generate the RF readout control pulse RF_RO.

The RF readout control signal RF_RO is applied to an input port of the directional coupler 815, and then coupled to the readout resonator 816. The readout resonator 816 is capacitively coupled to the superconducting qubit 802, thereby providing a qubit/resonator system. In some embodiments, the readout resonator 816 comprises, e.g., a half-wavelength coplanar waveguide resonator, having a resonant frequency that is the same or similar to a center frequency of the RF readout control signal RF_RO. The resonant frequency of the readout resonator 816 is detuned from the transition frequency of the superconducting qubit 802. In the dispersive regime of qubit-resonator coupling, the RF readout control signal RF_RO (with the requisite frequency tone, pulse envelope shape, and pulse duration) interacts with the given qubit/resonator system in a manner which results in the generation of a resulting readout signal RO that is reflected out from the readout resonator 816, wherein the readout signal RO comprises information (e.g., phase and/or amplitude) that is qubit-state dependent. In other words, the dispersive readout process yields an RF readout signal RO having a state-dependent phasor response, which is analyzed to discriminate the quantum state of the superconducting qubit 802.

The readout signal RO that is returned from the readout resonator 816 is input to the directional coupler 815, and then coupled out to the readout signal chain where the readout signal RO flows through the Josephson multipole multiband isolator circuit 820, and is amplified by the quantum-limited amplifier 821, and then transmitted along a signal chain comprising the filter 822 and other possible Josephson multipole multiband isolator circuits, and applied to an input of the second I/Q mixer 823. The Josephson multipole multiband isolator circuit 820 can be implemented using any of the exemplary microwave isolator circuits as discussed herein (e.g., FIG. 1, 2, 3, 5, 6, or 7). As schematically shown in FIG. 8, the Josephson multipole multiband isolator circuit 820 is controlled by a plurality of RF pump control signals P1, . . . , $P_n$, as discussed above. The Josephson multipole multiband isolator circuit 820 is utilized to shield the superconducting qubit 802 from excessive signal reflection and amplification of quantum noise from the downstream components in the readout signal path. The Josephson multipole multiband isolator circuit 820 is configured to ensure that all (or nearly all) of the power of the readout signal RO transmitted through to, e.g., the quantum-limited amplifier 821, while absorbing and isolating any power coming back from, e.g., the quantum-limited amplifier 821 to prevent perturbance of the state of the superconducting qubit 802 and other superconducting qubits of a quantum processor.

The second I/Q mixer 823 mixes the RF readout signal RO with the LO_RO signal to perform a down conversion operation where the RF readout signal RO is down converted and split into analog I and Q signals. The analog I and Q signals are input to the ADC circuitry 824 and sampled by the ADC circuitry 824 to generate respective digital I and Q signals that are indicative of the amplitude and phase of the readout signal RO. A discriminator analyzes the digital I and Q signals to discriminate the measured quantum state of the superconducting qubit 802 based on the amplitude and phase components of the readout signal RO.

It is to be understood that FIG. 8 is an exemplary non-limiting embodiment which schematically illustrates a high-level schematic illustration of readout control circuitry. The qubit readout control circuitry 800 and readout signal chain can be implemented using other components and configurations. For example, a frequency-multiplexed readout system (which implements frequency domain multiplexing) can be utilized to scale-up a readout chain in a quantum computing system for reading the quantum states of superconducting qubits in relatively large superconducting quantum computers. In a frequency-multiplexed readout system, multiple readout resonators (with different resonance frequencies) are coupled to separate qubits and commonly coupled to a communication bus. The communication bus is configured to allow the transmission of multiple readout signals with readout frequencies which match the resonance frequencies of the readout resonators, and, thus simultaneously read out the quantum states of multiple qubits using one input and one output line.

Figure 9:
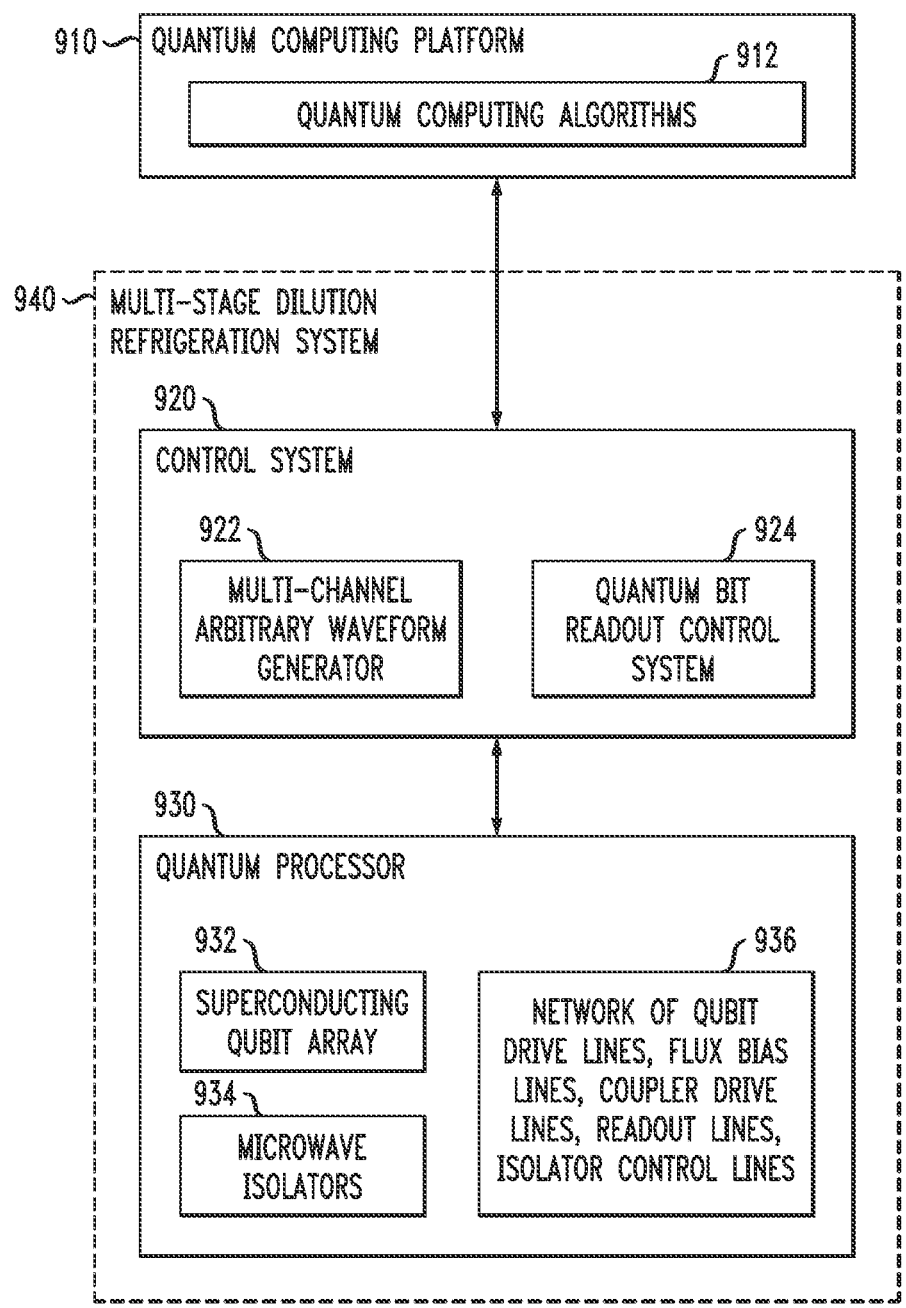
FIG. 9 schematically illustrates a quantum computing system, according to an exemplary embodiment of the disclosure.

FIG. 9 schematically illustrates a quantum computing system 900 which comprises a quantum computing platform 910, a control system 920, and a quantum processor 930. In some embodiments, the quantum computing platform 910 implements a software platform that is configured to program a quantum computer to execute quantum computing algorithms 912 which are implemented using, e.g., quantum circuits which define computational routings consisting of coherent quantum operations on quantum data, such as qubits. In addition, in some embodiments, the control system 920 comprises a multi-channel arbitrary waveform generator 922, and a quantum bit readout control system 924. The quantum processor 930 comprises one or more solid-state quantum chips which comprise, e.g., a superconducting qubit array 932, microwave isolator circuits 934, and a network 936 of qubit drive lines, coupler flux-bias control lines, qubit state readout lines, isolator control lines, and other circuit QED components that may be needed for a given application or quantum system configuration. The microwave isolator circuits 934 comprise Josephson multi-pole multiband isolator circuits that are implemented using any of the exemplary embodiments as discussed herein (e.g., FIG. 1, 2, 3, 5, 6, or 7)

In some embodiments, the control system 920 and the quantum processor 930 are disposed in a dilution refrigeration system 940 which can generate cryogenic temperatures that are sufficient to operate components of the control system 920 for quantum computing applications. For example, the quantum processor 930 may need to be cooled down to near-absolute zero, e.g., 10-15 millikelvin (mK), to allow the superconducting qubits to exhibit quantum behaviors. In some embodiments, the dilution refrigeration system 940 comprises a multi-stage dilution refrigerator where the components of the control system 920 can be maintained at different cryogenic temperatures, as needed. For example, while the quantum processor 930 may need to be cooled down to, e.g., 10-15 mK, the circuit components of the control system 920 may be operated at cryogenic temperatures greater than 10-15 mK (e.g., cryogenic temperatures in a range of 3K-4K), depending on the configuration of the quantum computing system. In some embodiments, the entirety of the control system 920, or some components thereof, are disposed in a room temperature environment.

In some embodiments, the superconducting qubit array 932 comprises a quantum system of superconducting qubits, superconducting qubit couplers, and other components commonly utilized to support quantum processing using qubits. The number of superconducting qubits of the superconducting qubit array 932 can be on the order of tens, hundreds, thousands, or more, etc. The network 936 of qubit drive lines, coupler flux bias control lines, and qubit state readout lines, etc., is configured to apply microwave control signals to superconducting qubits and coupler circuitry in the superconducting qubit array 932 to perform various types of gate operations, e.g., single-gate operations, entanglement gate operations, perform error correction operations, etc., as well as read the quantum states of the superconducting qubits. For example, microwave control pulses are applied to the qubit drive lines of respective superconducting qubits to change the quantum state of the superconducting qubits (e.g., change the quantum state of a given qubit between the ground state and excited state, or to a superposition state) when executing quantum information processing algorithms.

Furthermore, as noted above, the state readout lines comprise readout resonators that are coupled to respective superconducting qubits. The state of a given superconducting qubit can be determined through microwave transmission or reflection measurements using the readout ports of the readout resonator. The states of the superconducting qubits are read out after executing a quantum algorithm. In some embodiments, as noted above, a dispersive readout operation is performed in which a change in the resonant frequency of a given readout resonator, which is coupled to a given superconducting qubit, is utilized to readout the state (e.g., ground or excited state) of the given superconducting qubit.

The network 936 of qubit drive lines, coupler flux bias control lines, qubit state readout lines, and microwave isolator control lines, etc., is coupled to the control system 920 through a suitable hardware input/output (I/O) interface, which couples I/O signals between the control system 920 and the quantum processor 930. For example, the hardware I/O interface may comprise various types of hardware and components, such as RF cables, wiring, RF elements, optical fibers, heat exchanges, filters, amplifiers, isolators, etc.

In some embodiments, the multi-channel arbitrary waveform generator (AWG) 922 and other suitable microwave pulse signal generators are configured to generate the microwave control pulses that are applied to the qubit drive lines, and the coupler drive lines to control the operation of the superconducting qubits and associated qubit coupler circuitry, when performing various gate operations to execute a given certain quantum information processing algorithm. In some embodiments, the multi-channel AWG 922 comprises a plurality of AWG channels, which control respective superconducting qubits within the superconducting qubit array 932 of the quantum processor 930. In some embodiments, each AWG channel comprises a baseband signal generator, a digital-to-analog converter (DAC) stage, a filter stage, a modulation stage, an impedance matching network, and a phase-locked loop system to generate local oscillator (LO) signals (e.g., quadrature LO signals LO_I and LO_Q) for the respective modulation stages of the respective AWG channels.

In some embodiments, the multi-channel AWG 922 comprises a quadrature AWG system which is configured to process quadrature signals, wherein a quadrature signal comprises an in-phase (I) signal component, and a quadrature-phase (Q) signal component. In each AWG channel the baseband signal generator is configured to receive baseband data as input (e.g., from the quantum computing platform), and generate digital quadrature signals I and Q which represent the input baseband data. In this process, the baseband data that is input to the baseband signal generator for a given AWG channel is separated into two orthogonal digital components including an in-phase (I) baseband component and a quadrature-phase (Q) baseband component. The baseband signal generator for the given AWG channel will generate the requisite digital quadrature baseband IQ signals which are needed to generate an analog waveform (e.g., sinusoidal voltage waveform) with a target center frequency that is configured to operate or otherwise control a given quantum bit that is coupled to the output of the given AWG channel.

The DAC stage for the given AWG channel is configured to convert a digital baseband signal (e.g., a digital IQ signal output from the baseband signal generator) to an analog baseband signal (e.g., analog baseband signals I(t) and Q(t)) having a baseband frequency. The filter stage for the given AWG channel is configured to filter the IQ analog signal components output from the DAC stage to thereby generate filtered analog IQ signals. The modulation stage for the given AWG channel is configured to perform analog IQ signal modulation (e.g., single-sideband (SSB) modulation) by mixing the filtered analog signals I(t) and Q(t), which are output from the filter stage, with quadrature LO signals (e.g., an in-phase LO signal (LO_I) and a quadrature-phase LO signal (LO_Q)) to generate and output an analog RF signal (e.g., a single-sideband modulated RF output signal).

In some embodiments, the quantum bit readout control system 924 comprises a microwave pulse signal generator that is configured to apply a microwave tone to a given readout resonator line of a given superconducting qubit to perform a readout operation to readout the state of the given superconducting qubit, as well as circuitry that is configured to process the readout signal generated by the readout resonator line to determine the state of the given superconducting qubit, using techniques known to those of ordinary skill in the art. In some embodiments, the quantum bit readout control system 924 is implemented based on the readout circuitry of FIG. 8.

The quantum computing platform 910 comprises a software and hardware platform which comprises various software layers that are configured to perform various functions, including, but not limited to, generating and implementing various quantum applications using suitable quantum programming languages, configuring and implementing various quantum gate operations, compiling quantum programs into a quantum assembly language, implementing and utilizing a suitable quantum instruction set architecture (ISA), performing calibration operations to calibrate the quantum circuit elements and gate operations, etc. In addition, the quantum computing platform 910 comprises a hardware architecture of processors, memory, etc., which is configured to control the execution of quantum applications, and interface with the control system 920 to (i) generate digital control signals that are converted to analog microwave control signals by the control system 920, to control operations of the quantum processor 930 when executing a given quantum application, and (ii) to obtain and process digital signals received from the control system 920, which represent the processing results generated by the quantum processor 930 when executing various gate operations for a given quantum application.

Figure 10:
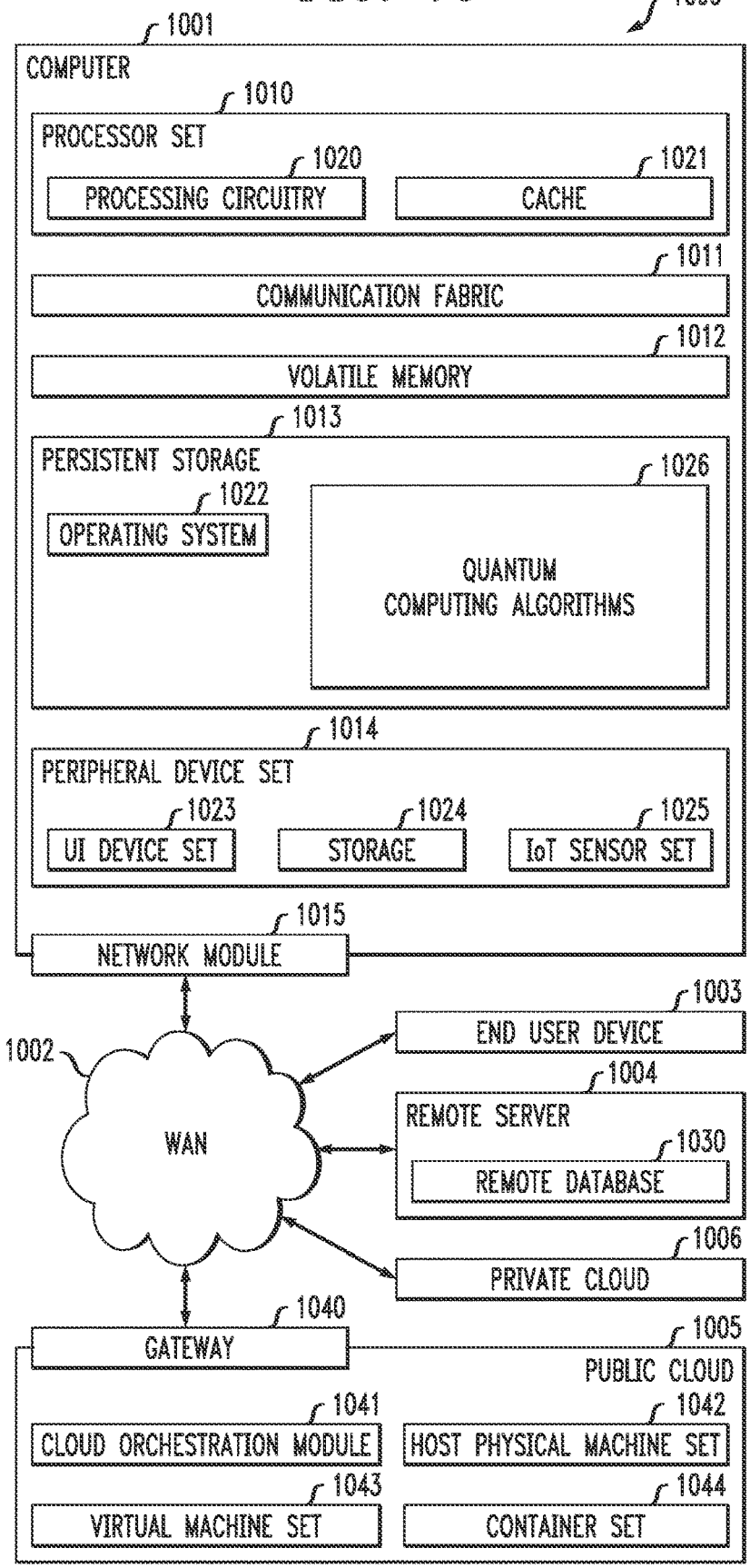
FIG. 10 schematically illustrates an exemplary architecture of a computing environment for hosting a quantum computing platform and performing quantum information processing, according to an exemplary embodiment of the disclosure.

In some exemplary embodiments, the quantum computing platform 910 of the quantum computing system 900 may be implemented using any suitable computing system architecture (e.g., as shown in FIG. 10) which is configured to implement methods to support quantum computing operations by executing computer readable program instructions that are embodied on a computer program product which includes a computer readable storage medium (or media) having such computer readable program instructions thereon for causing a processor to perform control methods as discussed herein.

Various aspects of the present disclosure are described by narrative text, flowcharts, block diagrams of computer systems and/or block diagrams of the machine logic included in computer program product (CPP) embodiments. With respect to any flowcharts, depending upon the technology involved, the operations can be performed in a different order than what is shown in a given flowchart. For example, again depending upon the technology involved, two operations shown in successive flowchart blocks may be performed in reverse order, as a single integrated step, concurrently, or in a manner at least partially overlapping in time.

A computer program product embodiment ("CPP embodiment" or "CPP") is a term used in the present disclosure to describe any set of one, or more, storage media (also called "mediums") collectively included in a set of one, or more, storage devices that collectively include machine readable code corresponding to instructions and/or data for performing computer operations specified in a given CPP claim. A "storage device" is any tangible device that can retain and store instructions for use by a computer processor. Without limitation, the computer readable storage medium may be an electronic storage medium, a magnetic storage medium, an optical storage medium, an electromagnetic storage medium, a semiconductor storage medium, a mechanical storage medium, or any suitable combination of the foregoing. Some known types of storage devices that include these mediums include: diskette, hard disk, random access memory (RAM), read-only memory (ROM), erasable programmable read-only memory (EPROM or Flash memory), static random-access memory (SRAM), compact disc read-only memory (CD-ROM), digital versatile disk (DVD), memory stick, floppy disk, mechanically encoded device (such as punch cards or pits/lands formed in a major surface of a disc) or any suitable combination of the foregoing. A computer readable storage medium, as that term is used in the present disclosure, is not to be construed as storage in the form of transitory signals per se, such as radio waves or other freely propagating electromagnetic waves, electromagnetic waves propagating through a waveguide, light pulses passing through a fiber optic cable, electrical signals communicated through a wire, and/or other transmission media. As will be understood by those of skill in the art, data is typically moved at some occasional points in time during normal operations of a storage device, such as during access, de-fragmentation or garbage collection, but this does not render the storage device as transitory because the data is not transitory while it is stored.

Computing environment 1000 of FIG. 10 contains an example of an environment for the execution of at least some of the computer code (block 1026) involved in executing quantum computing algorithms (e.g., quantum computing algorithms 912, FIG. 9). In addition to block 1026, computing environment 1000 includes, for example, computer 1001, wide area network (WAN) 1002, end user device (EUD) 1003, remote server 1004, public cloud 1005, and private cloud 1006. In this embodiment, computer 1001 includes processor set 1010 (including processing circuitry 1020 and cache 1021), communication fabric 1011, volatile memory 1012, persistent storage 1013 (including operating system 1022 and block 1026, as identified above), peripheral device set 1014 (including user interface (UI), device set 1023, storage 1024, and Internet of Things (IoT) sensor set 1025), and network module 1015. Remote server 1004 includes remote database 1030. Public cloud 1005 includes gateway 1040, cloud orchestration module 1041, host physical machine set 1042, virtual machine set 1043, and container set 1044.

Computer 1001 may take the form of a desktop computer, laptop computer, tablet computer, smart phone, smart watch or other wearable computer, mainframe computer, quantum computer or any other form of computer or mobile device now known or to be developed in the future that is capable of running a program, accessing a network or querying a database, such as remote database 1030. As is well understood in the art of computer technology, and depending upon the technology, performance of a computer-implemented method may be distributed among multiple computers and/or between multiple locations. On the other hand, in this presentation of computing environment 1000, detailed discussion is focused on a single computer, specifically computer 1001, to keep the presentation as simple as possible. Computer 1001 may be located in a cloud, even though it is not shown in a cloud in FIG. 10. On the other hand, computer 1001 is not required to be in a cloud except to any extent as may be affirmatively indicated.

Processor set 1010 includes one, or more, computer processors of any type now known or to be developed in the future. Processing circuitry 1020 may be distributed over multiple packages, for example, multiple, coordinated integrated circuit chips. Processing circuitry 1020 may implement multiple processor threads and/or multiple processor cores. Cache 1021 is memory that is located in the processor chip package(s) and is typically used for data or code that should be available for rapid access by the threads or cores running on processor set 1010. Cache memories are typically organized into multiple levels depending upon relative proximity to the processing circuitry. Alternatively, some, or all, of the cache for the processor set may be located "off chip." In some computing environments, processor set 1010 may be designed for working with qubits and performing quantum computing.

Computer readable program instructions are typically loaded onto computer 1001 to cause a series of operational steps to be performed by processor set 1010 of computer 1001 and thereby effect a computer-implemented method, such that the instructions thus executed will instantiate the methods specified in flowcharts and/or narrative descriptions of computer-implemented methods included in this document (collectively referred to as "the inventive methods"). These computer readable program instructions are stored in various types of computer readable storage media, such as cache 1021 and the other storage media discussed below. The program instructions, and associated data, are accessed by processor set 1010 to control and direct performance of the inventive methods. In computing environment 1000, at least some of the instructions for performing the inventive methods may be stored in block 1026 in persistent storage 1013.

Communication fabric 1011 is the signal conduction paths that allow the various components of computer 1001 to communicate with each other. Typically, this fabric is made of switches and electrically conductive paths, such as the switches and electrically conductive paths that make up busses, bridges, physical input/output ports and the like. Other types of signal communication paths may be used, such as fiber optic communication paths and/or wireless communication paths.

Volatile memory 1012 is any type of volatile memory now known or to be developed in the future. Examples include dynamic type random access memory (RAM) or static type RAM. Typically, the volatile memory is characterized by random access, but this is not required unless affirmatively indicated. In computer 1001, the volatile memory 1012 is located in a single package and is internal to computer 1001, but, alternatively or additionally, the volatile memory may be distributed over multiple packages and/or located externally with respect to computer 1001.

Persistent storage 1013 is any form of non-volatile storage for computers that is now known or to be developed in the future. The non-volatility of this storage means that the stored data is maintained regardless of whether power is being supplied to computer 1001 and/or directly to persistent storage 1013. Persistent storage 1013 may be a read only memory (ROM), but typically at least a portion of the persistent storage allows writing of data, deletion of data and re-writing of data. Some familiar forms of persistent storage include magnetic disks and solid-state storage devices. Operating system 1022 may take several forms, such as various known proprietary operating systems or open source Portable Operating System Interface type operating systems that employ a kernel. The code included in block 1026 typically includes at least some of the computer code involved in performing the inventive methods.

Peripheral device set 1014 includes the set of peripheral devices of computer 1001. Data communication connections between the peripheral devices and the other components of computer 1001 may be implemented in various ways, such as Bluetooth connections, Near-Field Communication (NFC) connections, connections made by cables (such as universal serial bus (USB) type cables), insertion type connections (for example, secure digital (SD) card), connections made though local area communication networks and even connections made through wide area networks such as the internet. In various embodiments, UI device set 1023 may include components such as a display screen, speaker, microphone, wearable devices (such as goggles and smart watches), keyboard, mouse, printer, touchpad, game controllers, and haptic devices. Storage 1024 is external storage, such as an external hard drive, or insertable storage, such as an SD card. Storage 1024 may be persistent and/or volatile. In some embodiments, storage 1024 may take the form of a quantum computing storage device for storing data in the form of qubits. In embodiments where computer 1001 is required to have a large amount of storage (for example, where computer 1001 locally stores and manages a large database) then this storage may be provided by peripheral storage devices designed for storing very large amounts of data, such as a storage area network (SAN) that is shared by multiple, geographically distributed computers. IoT sensor set 1025 is made up of sensors that can be used in Internet of Things applications. For example, one sensor may be a thermometer and another sensor may be a motion detector.

Network module 1015 is the collection of computer software, hardware, and firmware that allows computer 1001 to communicate with other computers through WAN 1002. Network module 1015 may include hardware, such as modems or Wi-Fi signal transceivers, software for packetizing and/or de-packetizing data for communication network transmission, and/or web browser software for communicating data over the internet. In some embodiments, network control functions and network forwarding functions of network module 1015 are performed on the same physical hardware device. In other embodiments (for example, embodiments that utilize software-defined networking (SDN)), the control functions and the forwarding functions of network module 1015 are performed on physically separate devices, such that the control functions manage several different network hardware devices. Computer readable program instructions for performing the inventive methods can typically be downloaded to computer 1001 from an external computer or external storage device through a network adapter card or network interface included in network module 1015.

WAN 1002 is any wide area network (for example, the internet) capable of communicating computer data over non-local distances by any technology for communicating computer data, now known or to be developed in the future. In some embodiments, the WAN may be replaced and/or supplemented by local area networks (LANs) designed to communicate data between devices located in a local area, such as a Wi-Fi network. The WAN and/or LANs typically include computer hardware such as copper transmission cables, optical transmission fibers, wireless transmission, routers, firewalls, switches, gateway computers and edge servers.

End user device (EUD) 1003 is any computer system that is used and controlled by an end user (for example, a customer of an enterprise that operates computer 1001), and may take any of the forms discussed above in connection with computer 1001. EUD 1003 typically receives helpful and useful data from the operations of computer 1001. For example, in a hypothetical case where computer 1001 is designed to provide a recommendation to an end user, this recommendation would typically be communicated from network module 1015 of computer 1001 through WAN 1002 to EUD 1003. In this way, EUD 1003 can display, or otherwise present, the recommendation to an end user. In some embodiments, EUD 1003 may be a client device, such as thin client, heavy client, mainframe computer, desktop computer and so on.

Remote server 1004 is any computer system that serves at least some data and/or functionality to computer 1001. Remote server 1004 may be controlled and used by the same entity that operates computer 1001. Remote server 1004 represents the machine(s) that collect and store helpful and useful data for use by other computers, such as computer 1001. For example, in a hypothetical case where computer 1001 is designed and programmed to provide a recommendation based on historical data, then this historical data may be provided to computer 1001 from remote database 1030 of remote server 1004.

Public cloud 1005 is any computer system available for use by multiple entities that provides on-demand availability of computer system resources and/or other computer capabilities, especially data storage (cloud storage) and computing power, without direct active management by the user. Cloud computing typically leverages sharing of resources to achieve coherence and economies of scale. The direct and active management of the computing resources of public cloud 1005 is performed by the computer hardware and/or software of cloud orchestration module 1041. The computing resources provided by public cloud 1005 are typically implemented by virtual computing environments that run on various computers making up the computers of host physical machine set 1042, which is the universe of physical computers in and/or available to public cloud 1005. The virtual computing environments (VCEs) typically take the form of virtual machines from virtual machine set 1043 and/or containers from container set 1044. It is understood that these VCEs may be stored as images and may be transferred among and between the various physical machine hosts, either as images or after instantiation of the VCE. Cloud orchestration module 1041 manages the transfer and storage of images, deploys new instantiations of VCEs and manages active instantiations of VCE deployments. Gateway 1040 is the collection of computer software, hardware, and firmware that allows public cloud 1005 to communicate through WAN 1002.

Some further explanation of virtualized computing environments (VCEs) will now be provided. VCEs can be stored as "images." A new active instance of the VCE can be instantiated from the image. Two familiar types of VCEs are virtual machines and containers. A container is a VCE that uses operating-system-level virtualization. This refers to an operating system feature in which the kernel allows the existence of multiple isolated user-space instances, called containers. These isolated user-space instances typically behave as real computers from the point of view of programs running in them. A computer program running on an ordinary operating system can utilize all resources of that computer, such as connected devices, files and folders, network shares, CPU power, and quantifiable hardware capabilities. However, programs running inside a container can only use the contents of the container and devices assigned to the container, a feature which is known as containerization.

Private cloud 1006 is similar to public cloud 1005, except that the computing resources are only available for use by a single enterprise. While private cloud 1006 is depicted as being in communication with WAN 1002, in other embodiments a private cloud may be disconnected from the internet entirely and only accessible through a local/private network. A hybrid cloud is a composition of multiple clouds of different types (for example, private, community or public cloud types), often respectively implemented by different vendors. Each of the multiple clouds remains a separate and discrete entity, but the larger hybrid cloud architecture is bound together by standardized or proprietary technology that enables orchestration, management, and/or data/application portability between the multiple constituent clouds. In this embodiment, public cloud 1005 and private cloud 1006 are both part of a larger hybrid cloud.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A device, comprising:
    filter circuitry comprising a first port, a second port, a first bandpass filter, and a second bandpass filter; and
    non-linear mixing devices which are responsive to control signals to couple poles of the first bandpass filter to respective poles of the second bandpass filter to cause non-reciprocal transmission of signals from the first port to the second port.

2. The device of claim 1, wherein the first bandpass filter and the second bandpass filter each comprise an immittance inverting bandpass filter.

3. The device of claim 1, wherein the non-linear mixing devices are driven by respective control signals having a same frequency and different phases.

4. The device of claim 3, wherein the respective control signals have similar or different amplitudes.

5. The device of claim 1, wherein:
    the first bandpass filter comprises a first passband with a first center frequency;
    the second bandpass filter comprises a second passband with a second center frequency;
    the first passband and the second passband are non-overlapping passbands; and
    the control signals are applied to the non-linear mixing devices and comprise radio frequency signals having a frequency which is a function of a difference between the first center frequency and the second center frequency.

6. The device of claim 1, wherein the non-linear mixing devices comprise direct current superconducting quantum interference devices.

7. The device of claim 1, wherein the non-linear mixing devices comprise Josephson parametric converter devices, wherein each Josephson parametric converter device comprises a Josephson ring modulator which is configured to couple respective poles of the first bandpass filter and the second bandpass filter.

8. The device of claim 1, wherein:
    the first bandpass filter comprises a first terminal that is connected to the first port and a second terminal that is connected to the second port;
    the second bandpass filter comprises a first terminal that is terminated and a second terminal that is terminated.

9. A system, comprising:
    a quantum processor comprising quantum bits;
    a readout signal path configured to transmit signals that are readout from one or more of the quantum bits of the quantum processor, the readout signal path comprising an isolator circuit which comprises:

filter circuitry comprising a first port, a second port, a first bandpass filter, and a second bandpass filter; and non-linear mixing devices which are responsive to control signals to couple poles of the first bandpass filter to respective poles of the second bandpass filter to cause non-reciprocal transmission of signals through the isolator circuit from the first port to the second port.

10. The system of claim 9, wherein the first bandpass filter and the second bandpass filter of the isolator circuit each comprise an immittance inverting bandpass filter.

11. The system of claim 9, wherein the non-linear mixing devices of the isolator circuit are driven by respective control signals having a same frequency and different phases.

12. The system of claim 11, wherein the respective control signals have similar or different amplitudes.

13. The system of claim 9, wherein:
the first bandpass filter comprises a first passband with a first center frequency;
the second bandpass filter comprises a second passband with a second center frequency;
the first passband and the second passband are non-overlapping passbands; and
the control signals are applied to the non-linear mixing devices and comprise radio frequency signals having a frequency which is a function of a difference between the first center frequency and the second center frequency.

14. The system of claim 9, wherein the non-linear mixing devices comprise direct current superconducting quantum interference devices.

15. The system of claim 9, wherein the non-linear mixing devices comprise Josephson parametric converter devices, wherein each Josephson parametric converter device comprises a Josephson ring modulator which is configured to couple respective poles of the first bandpass filter and the second bandpass filter.

16. The system of claim 9, wherein:
the first bandpass filter comprises a first terminal that is connected to the first port and a second terminal that is connected to the second port;
the second bandpass filter comprises a first terminal that is terminated and a second terminal that is terminated.

17. A device, comprising:
an isolator circuit, wherein the isolator circuit comprises:
a first port and a second port;
a first multipole immittance inverting bandpass filter;
a second multipole immittance inverting bandpass filter;
non-linear mixing devices which couple poles of the first multipole immittance inverting bandpass filter to respective poles of the second multipole immittance inverting bandpass filter; and
a transmission line commonly coupled to each of the non-linear mixing devices, and configured to apply a control signal to each of the non-linear mixing devices at a given frequency with different phase shifts, to cause non-reciprocal transmission of signals from the first port to the second port of the isolator circuit.

18. The device of claim 17, wherein:
the first multipole immittance inverting bandpass filter comprises a first passband with a first center frequency;
the second multipole immittance inverting bandpass filter comprises a second passband with a second center frequency;
the first passband and the second passband are non-overlapping passbands; and
the given frequency of the control signal is a function of a difference between the first center frequency and the second center frequency.

19. A system, comprising:
a quantum processor comprising quantum bits;
a readout signal path configured to transmit signals that are readout from one or more of the quantum bits of the quantum processor, the readout signal path comprising an isolator circuit which comprises:
a first port and a second port;
a first multipole immittance inverting bandpass filter;
a second multipole immittance inverting bandpass filter;
non-linear mixing devices which couple poles of the first multipole immittance inverting bandpass filter to respective poles of the second multipole immittance inverting bandpass filter; and
a transmission line commonly coupled to each of the non-linear mixing devices, and configured to apply a control signal to each of the non-linear mixing devices at a given frequency with different phase shifts, to cause non-reciprocal transmission of signals from the first port to the second port of the isolator circuit.

20. The system of claim 19, wherein:
the first multipole immittance inverting bandpass filter comprises a first passband with a first center frequency;
the second multipole immittance inverting bandpass filter comprises a second passband with a second center frequency;
the first passband and the second passband are non-overlapping passbands; and
the given frequency of the control signal is a function of a difference between the first center frequency and the second center frequency.

21. The system of claim 19, further comprising a signal generator configured to generate the control signal, wherein the control signal comprises a radio frequency current signal, and a control line which is coupled to the transmission line and configured to transmit the control signal from the signal generator to the transmission line.

22. A method comprising applying control signals to non-linear mixing devices, configured to couple poles of a first bandpass filter to respective poles of a second bandpass filter, to cause non-reciprocal transmission of signals from a first port of the first bandpass filter to a second port of the first bandpass filter.

23. The method of claim 22, wherein:
the first bandpass filter comprises a first passband with a first center frequency;
the second bandpass filter comprises a second passband with a second center frequency;
the first passband and the second passband are non-overlapping passbands; and
applying control signals to the non-linear mixing devices comprises driving the non-linear mixing devices with respective control signals having a given frequency and different phases, wherein the given frequency of each of the control signals is a function of a difference between the first center frequency and the second center frequency.

24. The method of claim 22, wherein the non-linear mixing devices comprise direct current superconducting quantum interference devices.

25. The method of claim 22, wherein the non-linear mixing devices comprise Josephson parametric converter devices, wherein each Josephson parametric converter device comprises a Josephson ring modulator which is configured to couple respective poles of the first bandpass filter and the second bandpass filter.

\* \* \* \* \*